US009502286B2

(12) United States Patent
Xie et al.

(10) Patent No.: US 9,502,286 B2
(45) Date of Patent: Nov. 22, 2016

(54) METHODS OF FORMING SELF-ALIGNED CONTACT STRUCTURES ON SEMICONDUCTOR DEVICES AND THE RESULTING DEVICES

(71) Applicant: GLOBALFOUNDRIES Inc., Grand Cayman (KY)

(72) Inventors: Ruilong Xie, Niskayuna, NY (US);
Chanro Park, Clifton Park, NY (US);
Min Gyu Sung, Latham, NY (US);
Hoon Kim, Clifton Park, NY (US);
Andre Labonte, Mechanicville, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/674,460

(22) Filed: Mar. 31, 2015

(65) Prior Publication Data
US 2016/0163585 A1 Jun. 9, 2016

Related U.S. Application Data

(60) Provisional application No. 62/088,074, filed on Dec. 5, 2014.

(51) Int. Cl.
| | | |
|---|---|---|
| H01L 21/44 | (2006.01) | |
| H01L 21/768 | (2006.01) | |
| H01L 21/283 | (2006.01) | |
| H01L 29/66 | (2006.01) | |
| H01L 29/417 | (2006.01) | |
| H01L 29/45 | (2006.01) | |

(52) U.S. Cl.
CPC ....... *H01L 21/76843* (2013.01); *H01L 21/283* (2013.01); *H01L 21/76802* (2013.01); *H01L 29/41775* (2013.01); *H01L 29/456* (2013.01); *H01L 29/665* (2013.01)

(58) Field of Classification Search
USPC ........................................ 438/652
See application file for complete search history.

(56) References Cited

U.S. PATENT DOCUMENTS

| | | | | |
|---|---|---|---|---|
| 2012/0007209 A1* | 1/2012 | Rhodes | ............. | H01L 21/76802 257/506 |
| 2014/0361352 A1* | 12/2014 | Hung | ................ | H01L 21/28008 257/288 |
| 2016/0163593 A1* | 6/2016 | Tsukamoto | ....... | H01L 21/76897 438/382 |

\* cited by examiner

*Primary Examiner* — Timor Karimy
(74) *Attorney, Agent, or Firm* — Amerson Law Firm, PLLC

(57) ABSTRACT

One method disclosed includes, among other things, forming a structure comprised of an island of a first insulating material positioned between the gate structures above the source/drain region and under a masking layer feature of a patterned masking layer, forming a liner layer that contacts the island of insulating material and the masking layer feature, selectively removing the masking layer feature to thereby form an initial opening that is defined by the liner layer, performing at least one isotropic etching process through the initial opening to remove the island of first insulating material and thereby define a contact opening that exposes the source/drain region, and forming a conductive contact structure in the contact opening that is conductively coupled to the source/drain region.

20 Claims, 23 Drawing Sheets

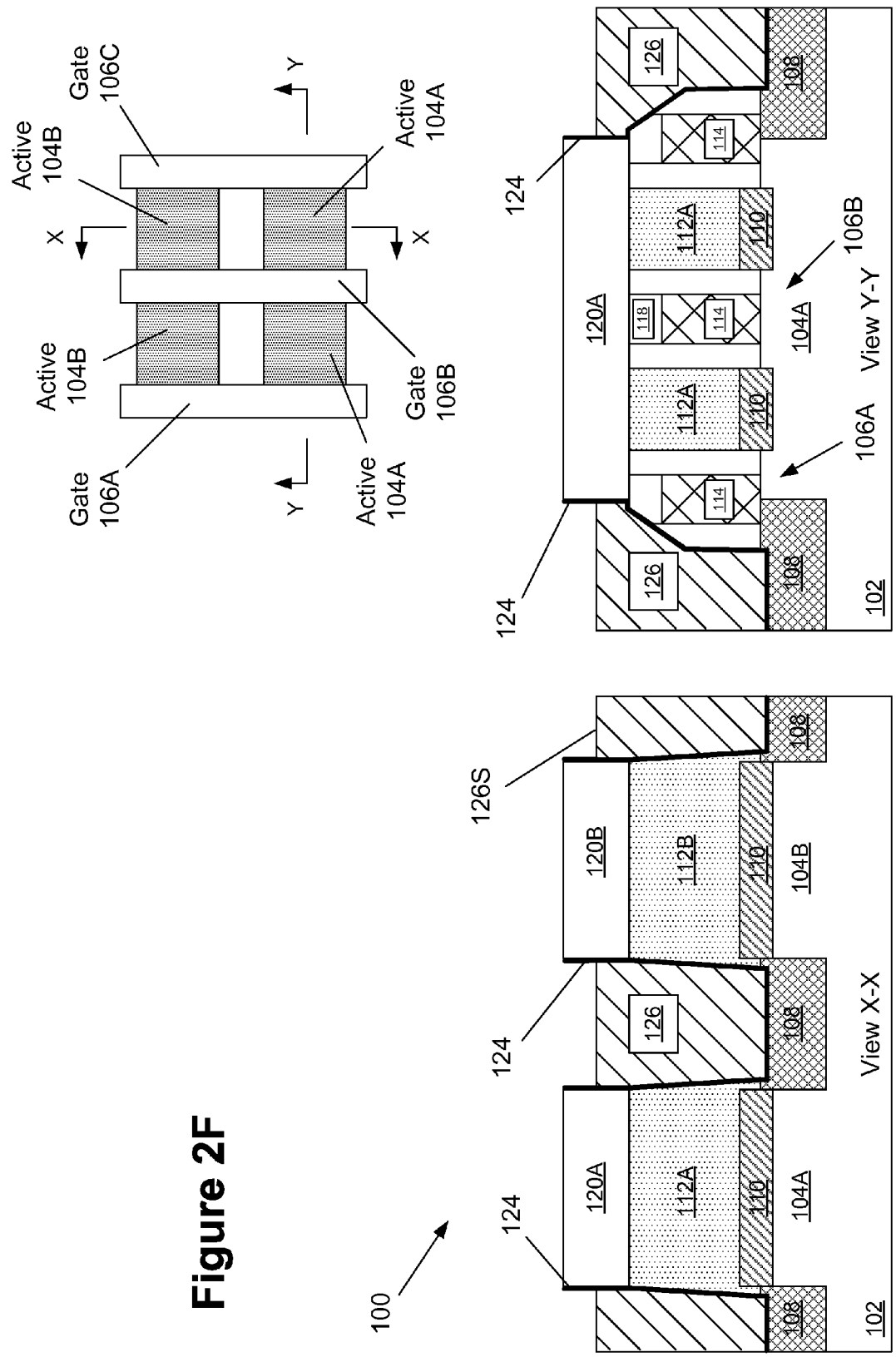

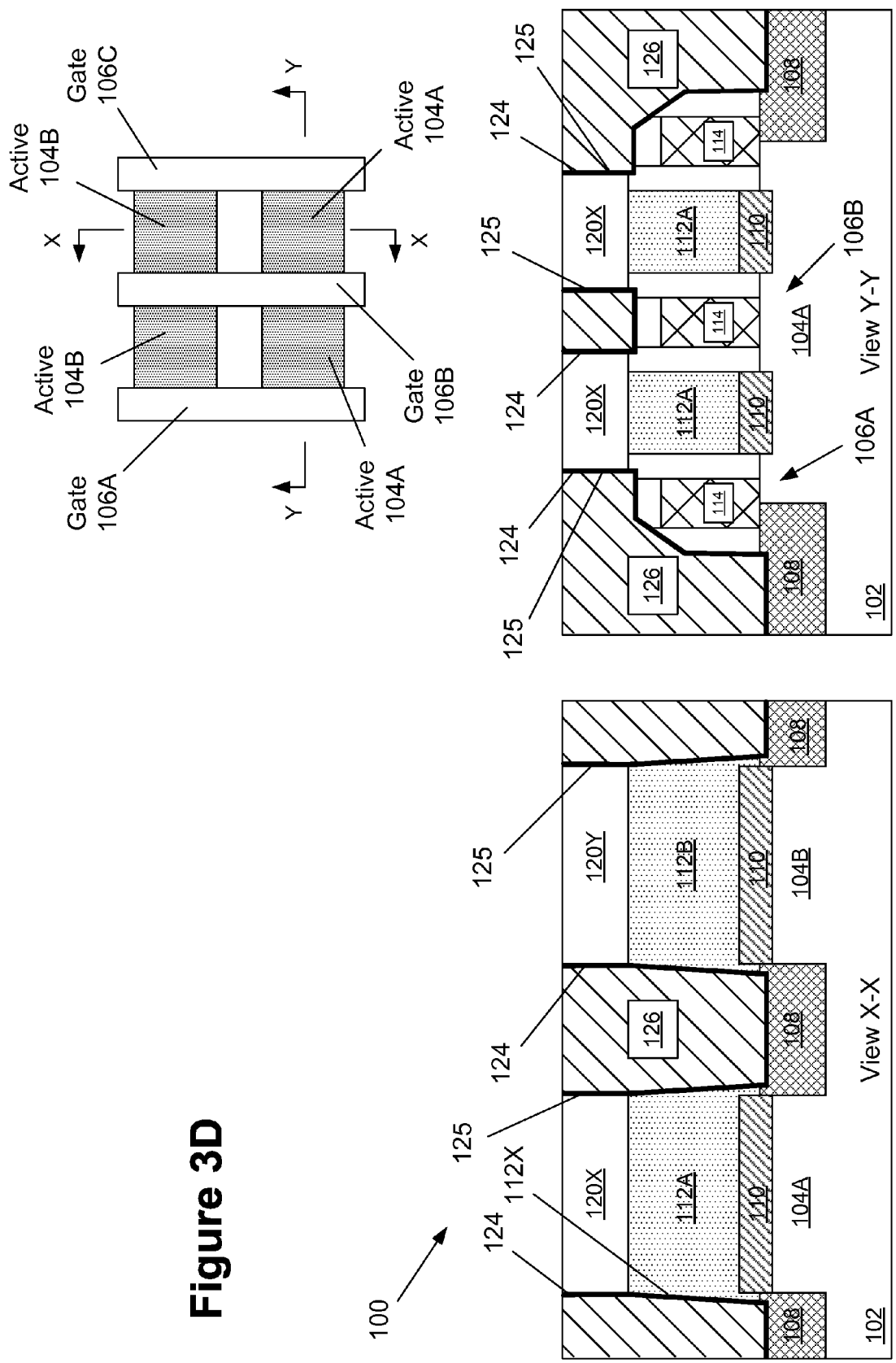

METHODS OF FORMING SELF-ALIGNED CONTACT STRUCTURES ON SEMICONDUCTOR DEVICES AND THE RESULTING DEVICES

BACKGROUND OF THE INVENTION

1. Field of the Invention

The present disclosure generally relates to the fabrication of integrated circuits, and, more particularly, to various methods of forming self-aligned contact (SAC) structures on semiconductor devices and the resulting semiconductor devices.

2. Description of the Related Art

In modern integrated circuit products, such as microprocessors, storage devices and the like, a very large number of circuit elements, especially transistors, are formed on a restricted chip area. In integrated circuits fabricated using metal-oxide-semiconductor (MOS) technology, field effect transistors (FETs) (both NMOS and PMOS transistors) are provided that are typically operated in a switching mode. That is, these transistor devices exhibit a highly conductive state (ON-state) and a high impedance state (OFF-state). FETs may take a variety of forms and configurations. For example, among other configurations, FETs may be either so-called planar FET devices or three-dimensional (3D) devices, such as FinFET devices.

A field effect transistor (FET), irrespective of whether an NMOS transistor or a PMOS transistor is considered, and irrespective of whether it is a planar or 3D FinFET device, typically comprises a doped source region and a separate doped drain region that are formed in a semiconductor substrate. The source and drain regions are separated by a channel region. A gate insulation layer is positioned above the channel region and a conductive gate electrode is positioned above the gate insulation layer. The gate insulation layer and the gate electrode may sometimes be referred to as the gate structure of the device. By applying an appropriate voltage to the gate electrode, the channel region becomes conductive and current is allowed to flow from the source region to the drain region. The gate structures for such planar FET devices may be manufactured using so-called "gate-first" or "replacement gate" (gate-last) manufacturing techniques.

Typically, due to the large number of circuit elements, e.g., transistors, and the required complex layout of modern integrated circuits, the electrical connections of the individual circuit elements cannot be established within the same device level on which the circuit elements are manufactured, but require one or more additional metallization layers, which generally include metal-containing lines providing the intra-level electrical connection, and also include a plurality of inter-level connections or vertical connections, which are also referred to as vias. These vertical interconnect structures comprise an appropriate metal and provide the electrical connection of the various stacked metallization layers.

Furthermore, in order to actually connect the circuit elements, i.e., the transistors, with the metallization layers, an appropriate vertical contact structure to the transistor device is formed, wherein a first end of the vertical contact structure is connected to a respective contact region of a circuit element, such as a gate electrode and/or the drain and source regions of transistors, and a second end that is connected to a respective metal line in the metallization layer by a conductive via. As device dimensions have decreased, and packing densities have increased, the physical space between adjacent gate structures is so small that it is very difficult to accurately position, align and form a contact opening in a layer of insulating material using traditional masking and etching techniques. Accordingly, contact-formation technologies have been developed in which contact openings are formed in a self-aligned manner by removing dielectric material, such as silicon dioxide, selectively from the spaces between closely spaced gate electrode structures. That is, after completing the transistor structures, the gate cap layer and the sidewall spacers of adjacent gate structures are effectively used as etch masks for selectively removing the silicon dioxide material in order to expose the source/drain regions of the transistors, thereby providing self-aligned trenches which are substantially laterally defined by the spacer structures positioned adjacent the gate structures.

However, the aforementioned process of forming self-aligned contacts results in an undesirable loss of the materials that protect the conductive gate electrode, i.e., the gate cap layer and the sidewall spacers, as will be explained with reference to FIGS. 1A-1B. FIG. 1A schematically illustrates a cross-sectional view of an integrated circuit product 10 at an advanced manufacturing stage. As illustrated, the product 10 comprises a plurality of illustrative gate structures 11 that are formed above a substrate 12, such as a silicon substrate. The gate structures 11 are comprised of an illustrative gate insulation layer 13 and an illustrative gate electrode 14 that are formed in a gate cavity 22 using a gate-last processing technique, an illustrative gate cap layer 16 and sidewall spacers 18. The gate cap layer 16 and sidewall spacers 18 encapsulate and protect the gate electrode 14 and gate insulation layer 13. The gate cap layer 16 and sidewall spacers 18 are typically made of silicon nitride. Also depicted in FIG. 1A are a plurality of raised source/drain regions 20 and a layer of insulating material 23, e.g., silicon dioxide.

FIG. 1B depicts the product 10 after a contact etching process was performed to form a contact opening 24 in the layer of insulating material 23 for a self-aligned contact. Although the contact etch process performed to form the opening 24 is primarily directed at removing the desired portions of the layer of insulating material 23, portions of the protective gate cap layer 16 and the protective sidewall spacers 18 get consumed during the contact etch process, as simplistically depicted in the dashed-line regions 26. Typically, when the layer of insulating material 23 is made of silicon dioxide, and the spacers 18 and gate cap layer 16 are made of silicon nitride, the contact etching process may be a dry, anisotropic (directional) plasma etching process that is intended to selectively remove the silicon dioxide layer 23 relative to the silicon nitride spacers 18/gate cap layer 16 of the gate structure 11. As device dimensions continue to shrink, the process margin for such a dry etching process is reduced, since the cap layer 16 and spacers 18 on advanced generation devices may only be about 25 nm and 7 nm thick, or less, respectively. For example, if only 3 nm of thickness (or width) of the spacers 18 is lost during the contact etching process, then the resulting device 10 may not be acceptable in that many device specifications specify that, after the contact etching process is performed, the final spacer must have a minimum thickness or width of 5 nm.

One possible solution would to employ a wet, isotropic etching process, such as BHF-based process or the well-known Frontier isotropic oxide removal process, to form the contact openings 24. Such wet, isotropic etching processes are desirable because they exhibit a higher degree of etch selectivity (silicon dioxide versus silicon nitride) than does the aforementioned dry anisotropic etching process. Accordingly, less of the spacer 18 and the gate cap layer 16 would be consumed using such a wet etching process. However, given the isotropic (non-directional) nature of such an isotropic etching process, controlling the area or amount of the layer of insulating material 23 that is removed so as to define the contact opening 24, i.e., controlling the size and configuration of the contact opening 24 when viewed from above, is difficult. Absent the ability to control the size and configuration of the contact opening 24, sometimes referred to as "blowing-up the contact opening CD" in the industry, conductive contact structures may be formed in areas where they are not supposed to be and thereby result in the formation of undesirable electrical short-circuits. As one example, absent proper control of the size and shape of the contact opening 24, the conductive contact structure that will ultimately be formed therein may short to adjacent active regions or form around an end of the gate structure, creating a short circuit between the source region and the drain region of one of the transistor devices.

The present disclosure is directed to various methods of forming self-aligned contact (SAC) structures on semiconductor devices and the resulting semiconductor devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming self-aligned contact (SAC) structures on semiconductor devices and the resulting semiconductor devices. One method disclosed includes, among other things, forming a structure comprised of an island of a first insulating material positioned between the gate structures above the source/drain region and under a masking layer feature of a patterned masking layer, forming a liner layer that contacts the island of the first insulating material and the masking layer feature, selectively removing the masking layer feature to thereby form an initial opening that is defined by the liner layer, the initial opening exposing the island of first insulating material, performing at least one isotropic etching process through the initial opening to remove the island of first insulating material and thereby define a contact opening that exposes the source/drain region, and forming a conductive contact structure in the contact opening that is conductively coupled to the source/drain region.

One illustrative integrated circuit product disclosed herein includes, among other things, first and second source/drain regions defined in first and second spaced-apart active regions, respectively, defined in a semiconductor substrate, an isolation structure positioned between the first and second spaced-apart active regions, first and second source/drain contact structures that are conductively coupled to the first and second source/drain regions, respectively, a liner layer that is positioned above the isolation structure and on and in contact with both the first and second source/drain contact structures and a layer of insulating material positioned between the first and second source/drain contact structures, above the isolation structure and on and in contact with the liner layer.

BRIEF DESCRIPTION OF THE DRAWINGS

The disclosure may be understood by reference to the following description taken in conjunction with the accompanying drawings, in which like reference numerals identify like elements, and in which:

FIGS. 2A-2M depict various illustrative methods disclosed for forming self-aligned contact (SAC) structures on semiconductor devices and the resulting semiconductor devices; and FIGS. 3A-3I depict yet other illustrative methods disclosed for forming self-aligned contact (SAC) structures on semiconductor devices and the resulting semiconductor devices.

Figure 1B:
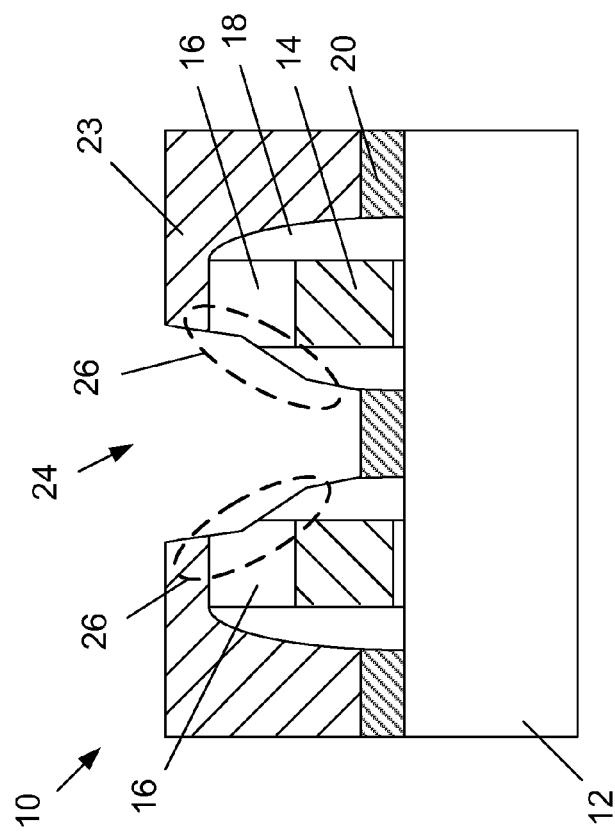
FIGS. 1A-1B depict one illustrative prior art method of forming self-aligned contacts and some of the problems that may be encountered using such prior art processing techniques.
Figure 1A:
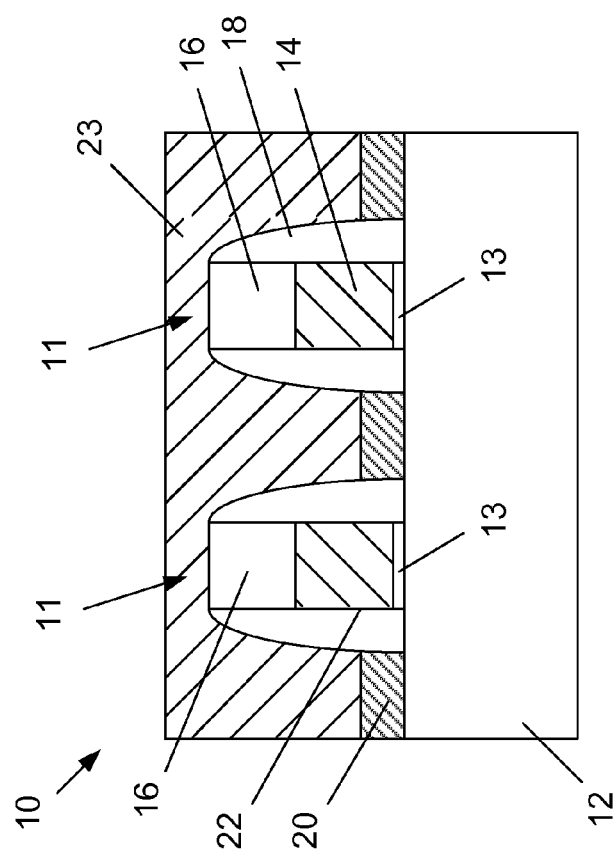

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming self-aligned contact (SAC) structures on semiconductor devices and the resulting semiconductor devices. Moreover, as will be readily apparent to those skilled in the art upon a complete reading of the present application, the present method is applicable to a variety of devices, including, but not limited to, planar transistor devices, FinFET devices, nanowire devices, and the methods disclosed herein may be employed to form N-type or P-type semiconductor devices. The methods and devices disclosed herein may be employed in manufacturing products using a variety of technologies, e.g., NMOS, PMOS, CMOS, etc., and they may be employed in manufacturing a variety of different products, e.g., memory products, logic products, ASICs, etc. Of course, the inventions disclosed herein should not be considered to be limited to the illustrative examples depicted and described herein. With reference to the attached figures, various illustrative embodiments of the methods and devices disclosed herein will now be described in more detail.

FIGS. 2A-2M depict various illustrative methods disclosed for forming self-aligned contact (SAC) structures on semiconductor devices and the resulting semiconductor devices. The illustrative product 100 will be formed in and above the semiconductor substrate 102. The product 100 may include either NMOS or PMOS transistors. Additionally, various doped regions, e.g., source/drain regions, halo implant regions, well regions and the like, are not depicted in the attached drawings. The substrate 102 may have a variety of configurations, such as the depicted bulk silicon configuration. The substrate 102 may also have a silicon-on-insulator (SOI) configuration that includes a bulk silicon layer, a buried insulation layer and an active layer, wherein semiconductor devices are formed in and above the active layer. The substrate 102 may be made of silicon or it may be made of materials other than silicon. Thus, the terms "substrate" or "semiconductor substrate" should be understood to cover all semiconducting materials and all forms of such materials. As noted above, the inventions disclosed herein may be employed in making any of a variety of different devices, e.g., planar transistor devices, FinFET devices, nanowire devices, etc. The various layers of material described below may be formed by any of a variety of different known techniques, e.g., a chemical vapor deposition (CVD) process, an atomic layer deposition (ALD) process, a thermal growth process, spin-coating techniques, etc. Moreover, as used herein and in the attached claims, the word "adjacent" is to be given a broad interpretation and should be interpreted to cover situations where one feature actually contacts another feature or is in close proximity to that other feature.

In general, the illustrative product 100 will be depicted as being comprised of three illustrative gate structures 106A-106C (generally referred to by the reference number 106) formed above two isolated active regions 104A-104B (generally referred to by the reference number 104). As will be appreciated by those skilled in the art, relative to the transistor devices that will be formed above the active regions 104, the gate structures 106A and 106C are "active edge gates" in that they are formed on the edges of the active regions 104A/B, while the gate 106B is the active or functional gate. In some cases, the gate structures 106A and 106C may be "dummy gates." FIGS. 2A-2K present various cross-sectional views of one illustrative embodiment of product 100 that may be formed using the methods disclosed herein. The drawings also include a simplistic plan view of the product 100 (in the upper right corner) that depicts the location where various cross-sectional views depicted in the following drawings will be taken. More specifically, the view "X-X" is a cross-sectional view that is taken through the source/drain regions defined in the active regions 104A and 104B in a direction that is parallel to the long axis of the gate structures (i.e., the channel width direction), while the view "Y-Y" is a cross-sectional view that is taken through the gates 106A-C above the active region 104A (i.e., in a direction that is parallel to the current transport direction when the transistors are in operation). The illustrative process flows described herein will be shown in the cross-sectional views of the drawings, i.e., no attempt will be made to show such changes in the illustrative and simplistically depicted plan views in the drawings.

Figure 2A:
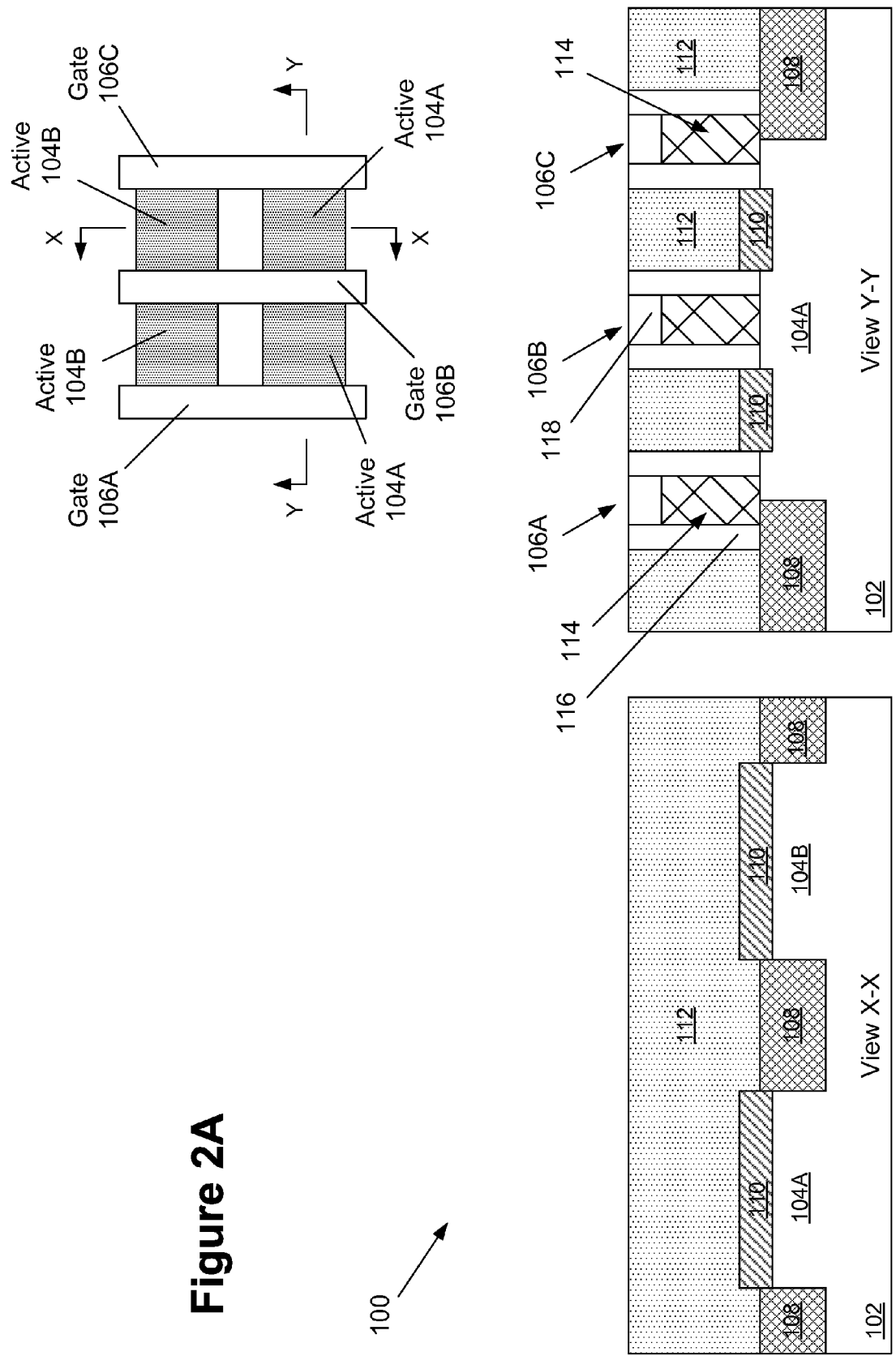

FIG. 2A depicts the product 100 at a point in fabrication wherein several process operations have been performed. More specifically, FIG. 2A depicts the product after isolation regions 108 were defined in the substrate 102 so as to electrically isolate the active regions 104A-B from one another, after the schematically depicted gates 106 were formed so as to span across both of the active regions 104, after illustrative raised source/drain regions 110 (e.g., epi semiconductor material) were formed adjacent the gate structures, after a layer of insulating material 112, e.g., silicon dioxide, and after a CMP process was performed on the layer of insulating material 112 using the depicted gate cap layers 118 as a polish-stop. The gate structures 106 are comprised of a simplistically depicted gate 114, sidewall spacers 116 and a gate cap layer 118. The gates 114 of the gate structures 106 may be manufactured using any desired technique, e.g., using well-known replacement gate manufacturing techniques or well-known "gate first" manufacturing techniques. The gates 114 that are depicted herein are intended to be representative in nature of any type of gates that may be employed in manufacturing integrated circuit products. Such gates 114 will typically include a gate insulation layer (not separately shown), e.g., a layer of silicon dioxide or a layer of a high-k (k value greater than 10) material, such as hafnium oxide. The gates 114 will also include one or more conductive materials that will serve as the gate electrode (not separately shown). Such conductive materials may be comprised of polysilicon or one or more layers of metal or metal compounds. The spacers 116 and the gate cap layers 118 may be comprised of a variety of materials, e.g., silicon nitride, and they may be formed using techniques that are well known to those skilled in the art.

Figure 2B:
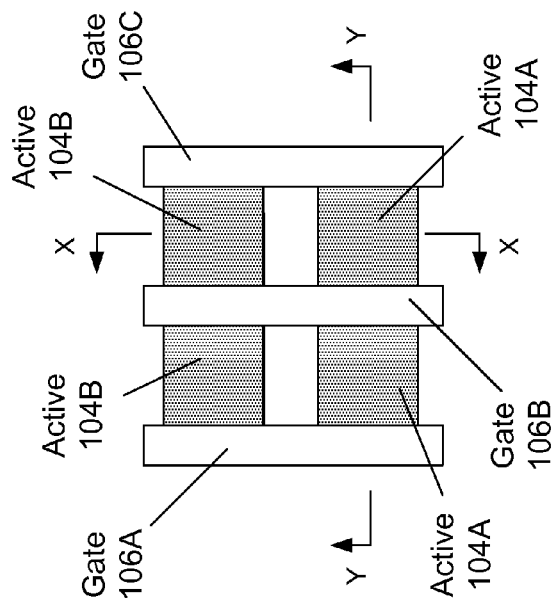
Figure 2B:
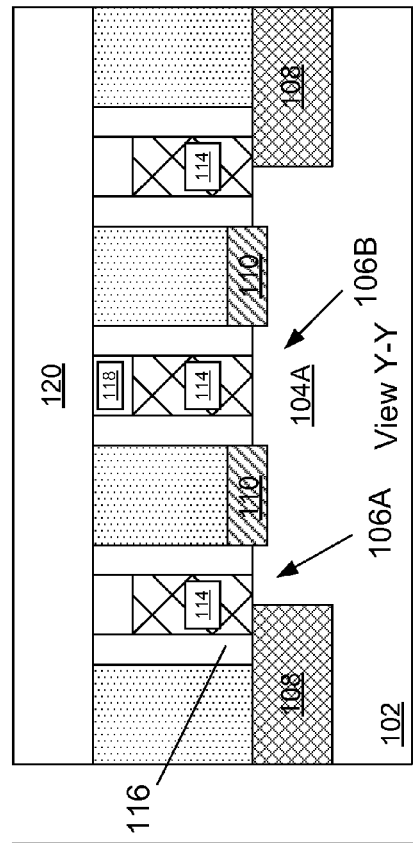
Figure 2B:
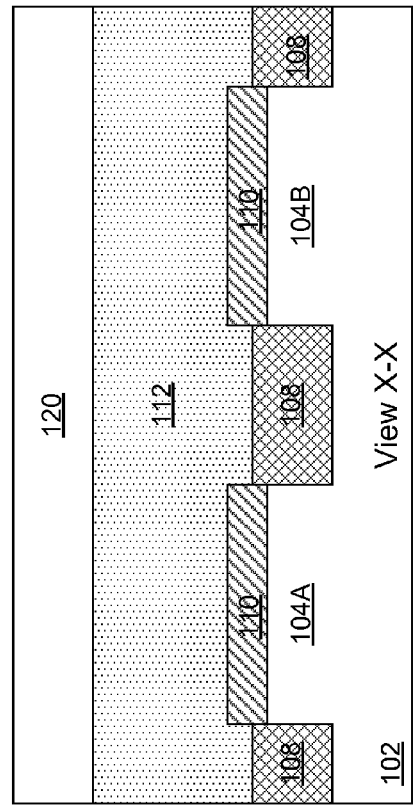

FIG. 2B depicts the product 100 after a layer of masking material 120 is blanket deposited above the product 100. The layer of masking material 120 may be comprised of a variety of different materials, e.g., amorphous silicon, polysilicon, amorphous carbon, etc., and it may be formed to any desired thickness.

Figure 2C:
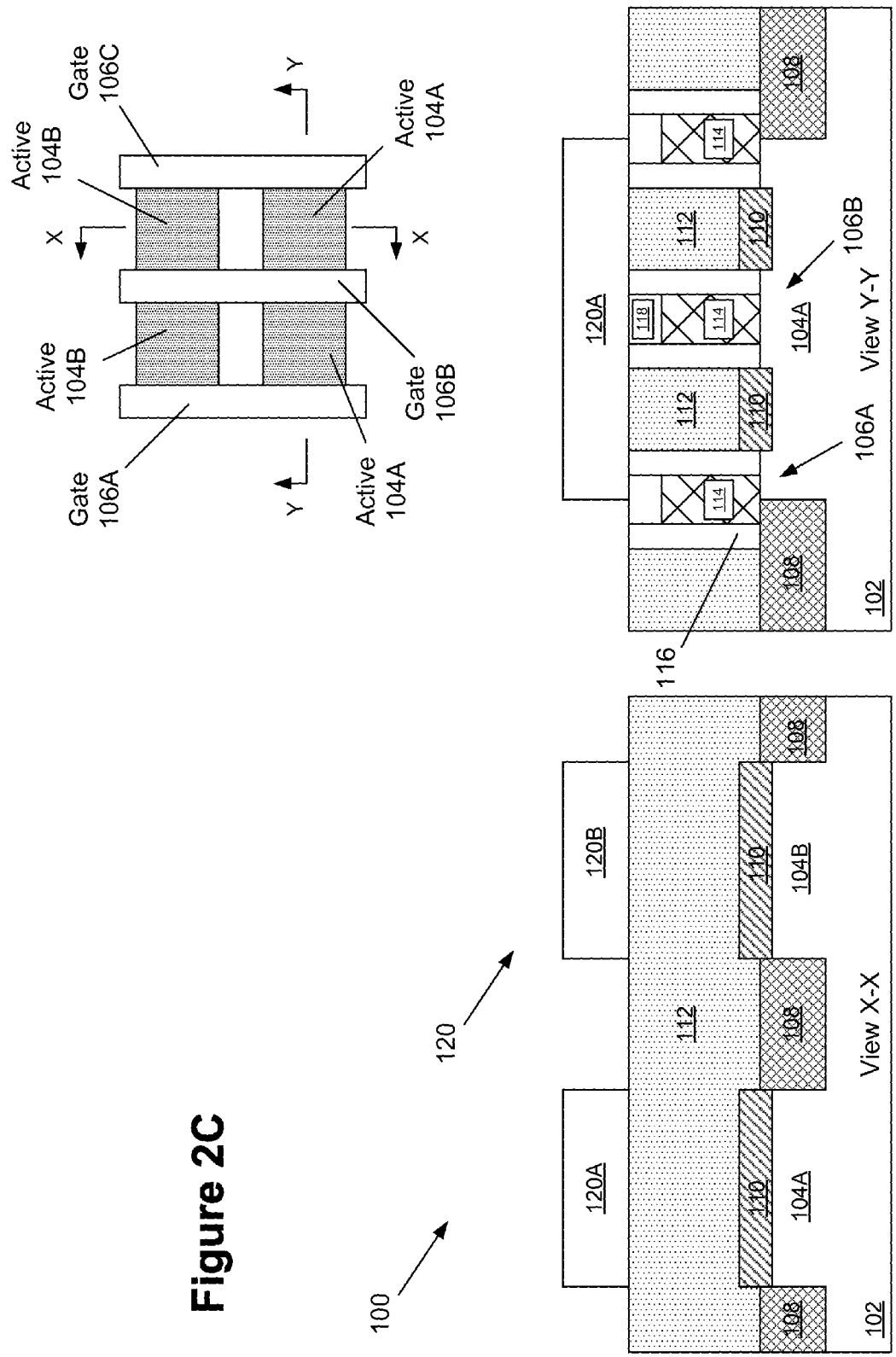

FIG. 2C depicts the product 100 after one or more etching processes were performed through a patterned etch mask (not shown) to pattern the layer of masking material 120 and thereby define a patterned masking layer 120 comprised of masking layer features 120A-B. As depicted, the patterned masking layer 120 covers the active regions 104A-B but leaves portions of the layer of insulating material 112 exposed for further processing. In this embodiment (see view Y-Y), the masking layer feature 120A covers the functional gate structure 106B and the insulating material 112 positioned above the source/drain regions 110, as well as portions of the active-edge gate structures 106A and 106C.

Figure 2D:
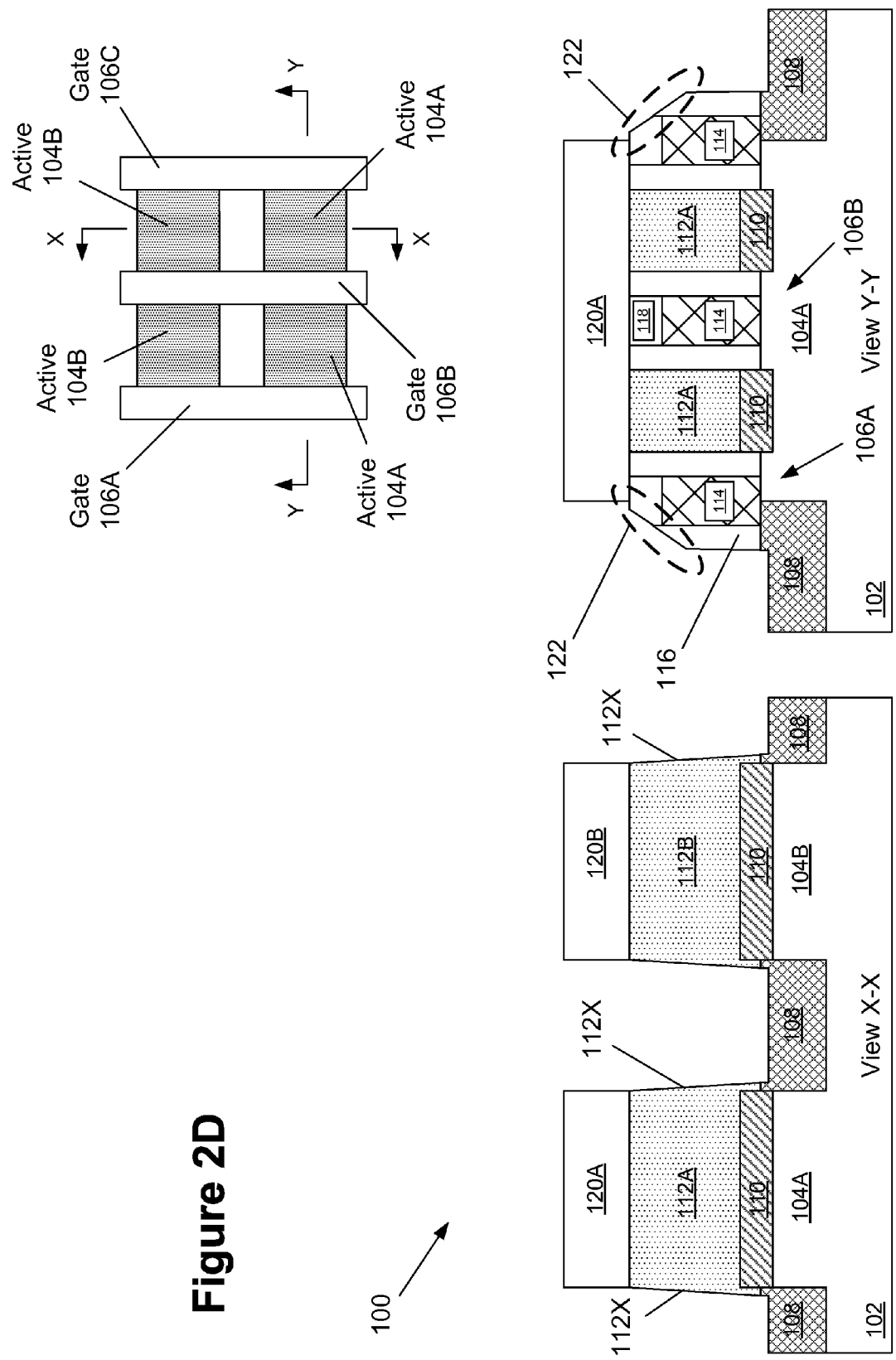

FIG. 2D depicts the product 100 after one or more etching processes were performed through the patterned masking layer 120 to remove the exposed portions of the layer of insulating material 112. This etching process results in the formation of islands of the insulating material 112A and 112B positioned, respectively, above the first and second active regions 104A and 104B and under the masking layer features 120A and 120B. As indicated in the view X-X, the ends 112X of the islands of the insulating material 112A and 112B are exposed by this etching process. As depicted in the dashed-line regions 122 (view Y-Y), during this etching process, some of the exposed portions of the spacers 116 and gate cap layers 118 of the active-edge gate structures 106A and 106C may be consumed. However, the gate cap layer 118 and the spacers 116 of the gate structure 106B are protected by the masking layer feature 120A of the patterned masking layer 120 during this etching process.

Figure 2E:
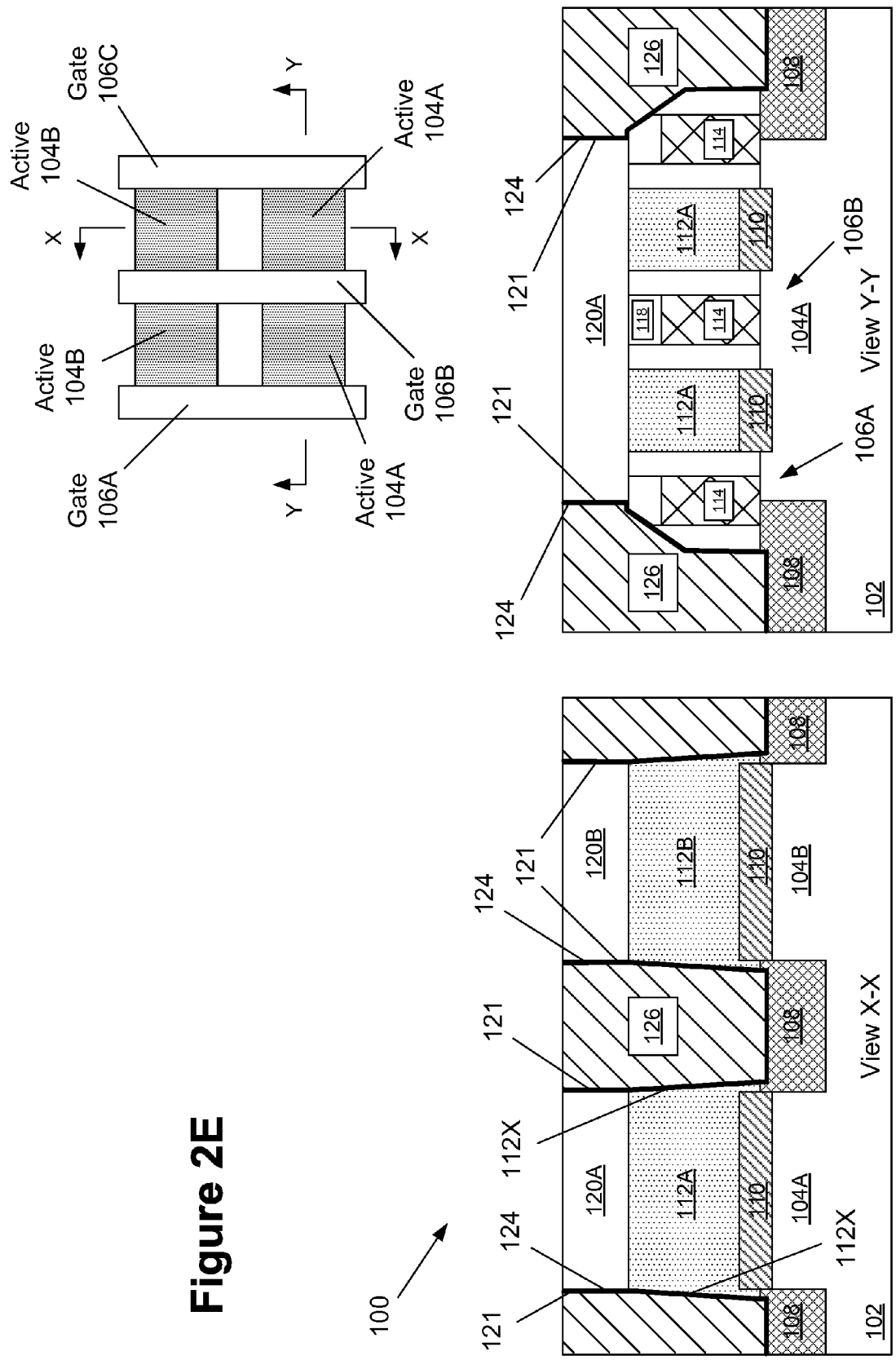

FIG. 2E depicts the product 100 after several process operations were performed. First, a liner layer 124 was formed on the product 100 by performing a conformal deposition process. The liner layer 124 is formed such that it contacts the ends 112X of the islands of the insulating material 112A and 112B, as well as all of the side surfaces 121 of the masking layer features 120A-B. Then, another layer of insulating material 126, e.g., silicon dioxide, was blanket-deposited across the product 100. Next, one or more planarization processes (e.g., CMP) were performed on the layer of insulating material 126 and the liner layer 124 such that the upper surface of the layer of insulating material 126 was substantially even with the upper surface of the patterned masking layer 120. This clears the liner layer 124 and the layer of insulating material 126 from above the masking layer features 120A-B. The liner layer 124 may be comprised of a variety of materials, e.g., silicon nitride, a low-k nitride (such as SiBCN), $Al_2O_3$, etc., and it may be formed by performing a conformal ALD or CVD process. The thickness of the liner layer 124 may vary depending upon the particular application, e.g., about 3-15 nm depending upon the particular application. The layer of insulating material 126 may be comprised of a variety of materials, such as silicon dioxide.

FIG. 2F depicts the product 100 after a timed, recess etching process was performed on the exposed portions of the layer of insulating material 126 to form a recessed layer of insulating material 126 having a recessed upper surface 126S. The amount of recessing of the layer of insulating material 126 may vary depending upon the particular application.

Figure 2G:
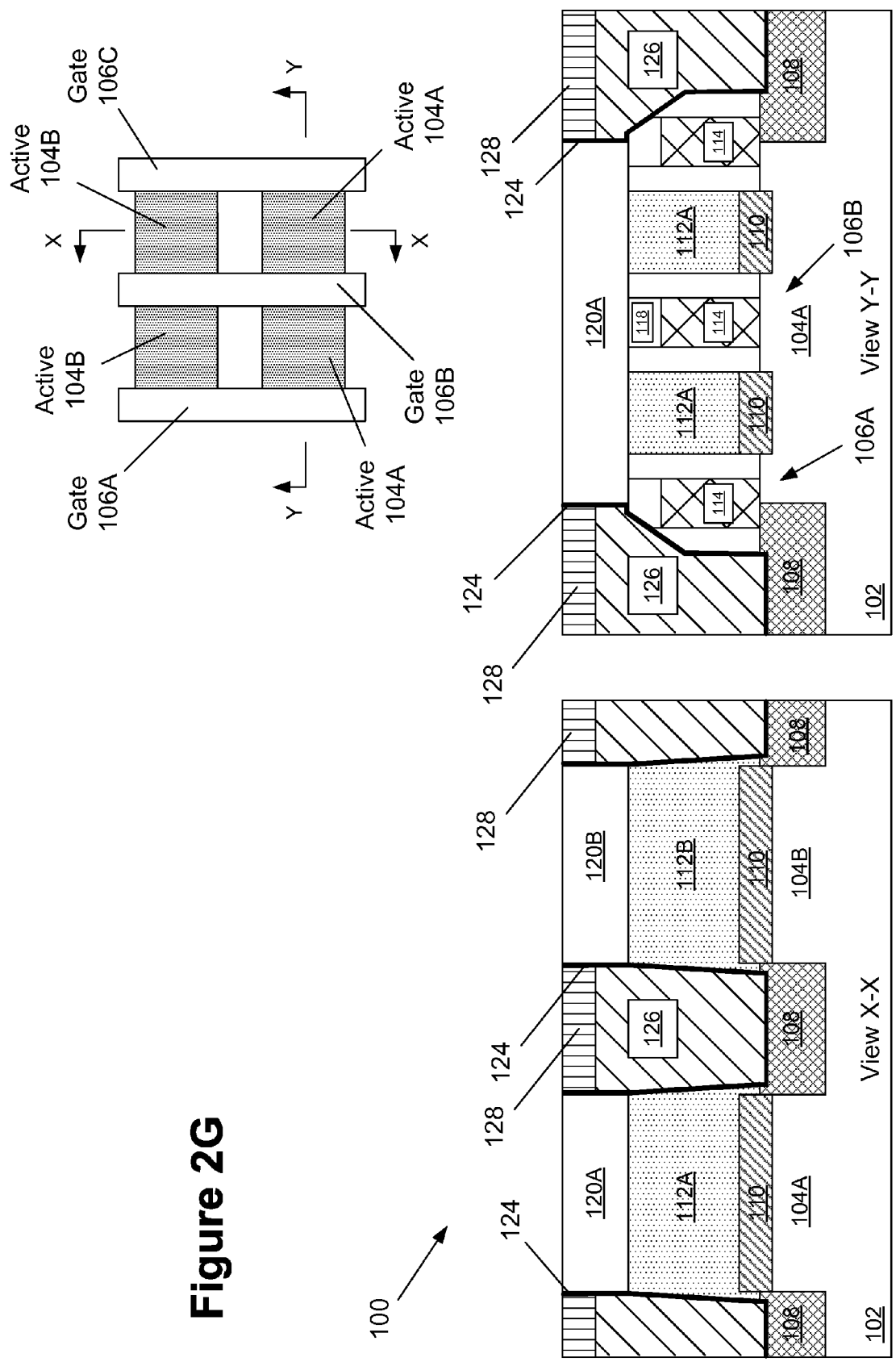

FIG. 2G depicts the product 100 after additional protective cap layers 128 were formed on the recessed layer of insulating material 126. The cap layers 128 may be comprised of a variety of different materials, e.g., silicon nitride. The cap layers 128 may be formed by depositing a layer of cap material so as to over-fill the recesses above the recessed layer of insulating material 126, and thereafter performing a CMP process that stops on the patterned masking layer 120.

Figure 2H:
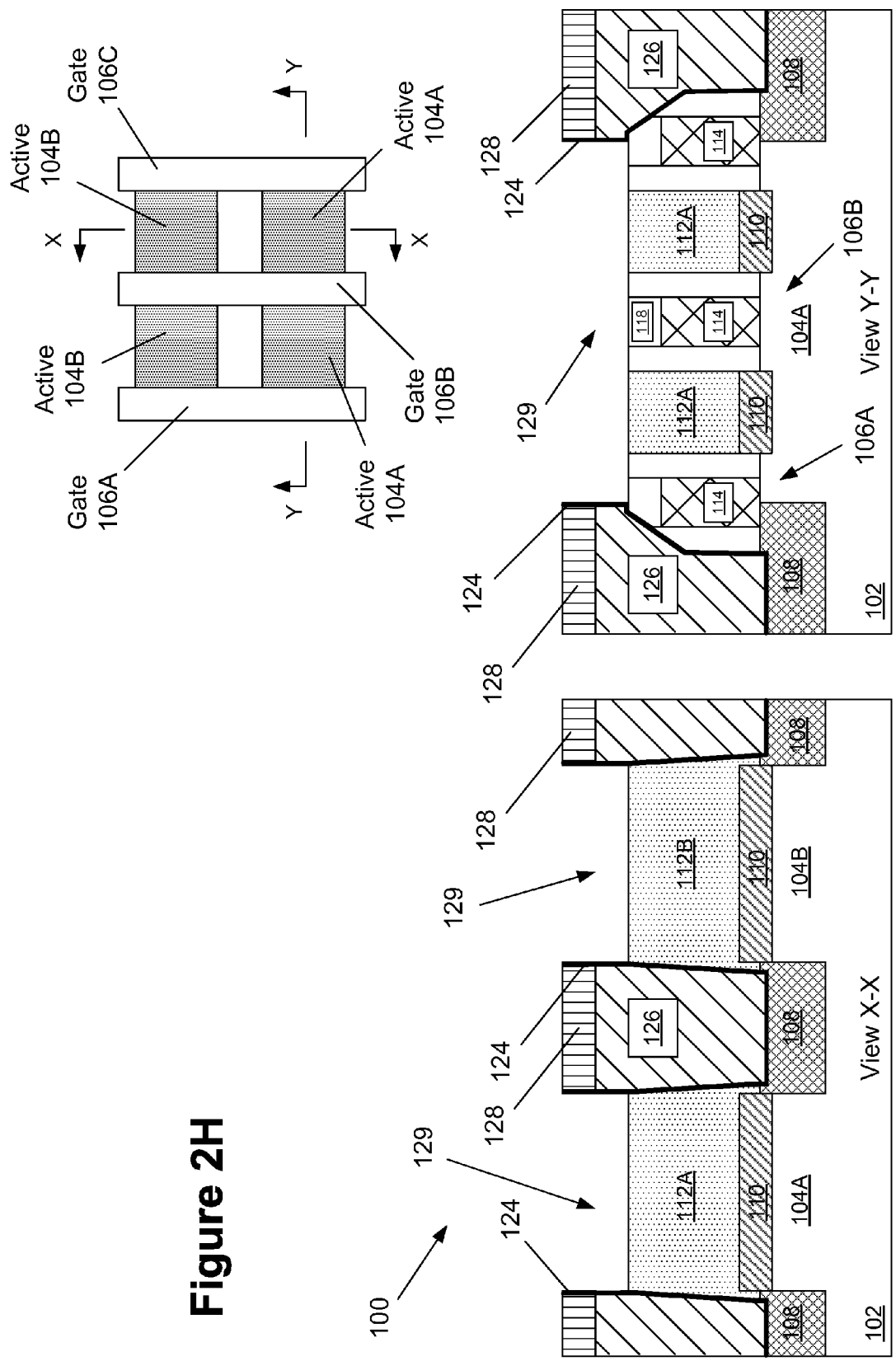

FIG. 2H depicts the product after a selective etching process was performed to selectively remove the patterned masking layer 120, including the masking layer features 120A-B, relative to the surrounding materials. This results in the formation of a plurality of initial openings 129 that expose the gate structure 106B as well as the islands of the insulating material 112A and 112B. Note that these openings 129 are defined by the liner layer 124.

Figure 2I:
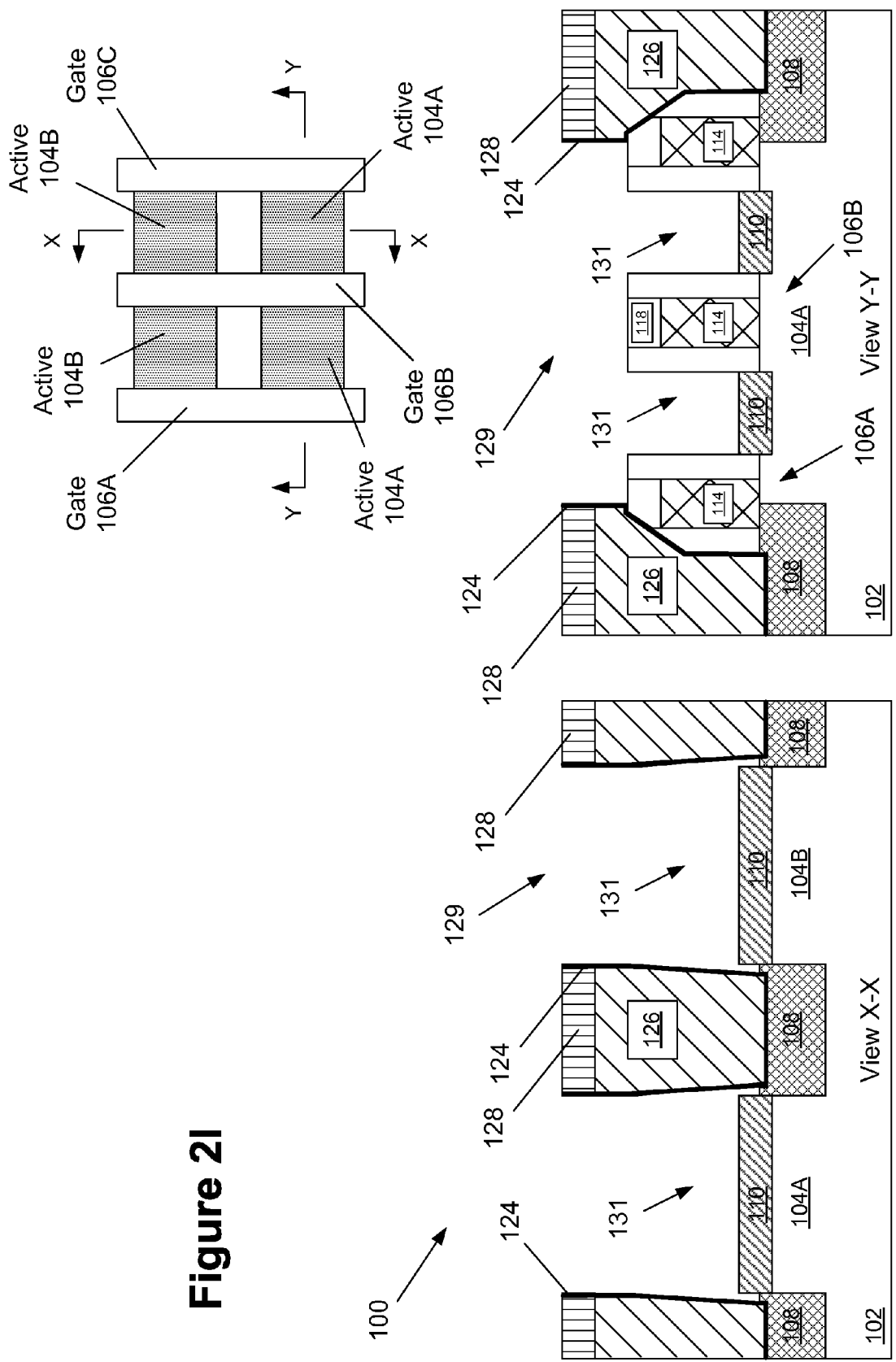

FIG. 2I depicts the product 100 after a selective etching process was performed to selectively remove the exposed islands of the insulating material 112A and 112B relative to the surrounding materials. As depicted, this defines contact openings 131 that expose the source/drain regions 110 in the first and second active regions 104A-B for further processing. Importantly, using the methods disclosed herein, during this etching process, the portions of the layer of insulating material 126 are completely encapsulated by protective materials, e.g., the liner layer 124 and the cap layers 128, as depicted in FIG. 2I. As one particular example, in the case where the layer of insulating materials 112 and 126 are comprised of silicon dioxide, the liner layer 124 and the cap layer 128 may be comprised of silicon nitride. Thus, using the methods disclosed herein, there is less chance of "blow-out" or loss of dimensional control of the size of the openings 131 where conductive materials will subsequently be formed on the product 100 to establish electrical connections to the source/drain regions 110. More specifically, there is less chance of so called "trench silicide" materials growing in undesired areas, such as around the end of the gate structure 106B or so as to contact another active region. The selective etching process that is performed to remove the exposed islands of the insulating material 112A and 112B and thereby form the contact openings 131 is different than a conventional plasma dry etch process. Since the openings 131 are bounded by silicon nitride material (in this example), a more selective etching process, such as a wet BHF oxide removal process, may be used without concern of "blow-out" of the critical dimensions or size of the contact openings 131.

Figure 2J:
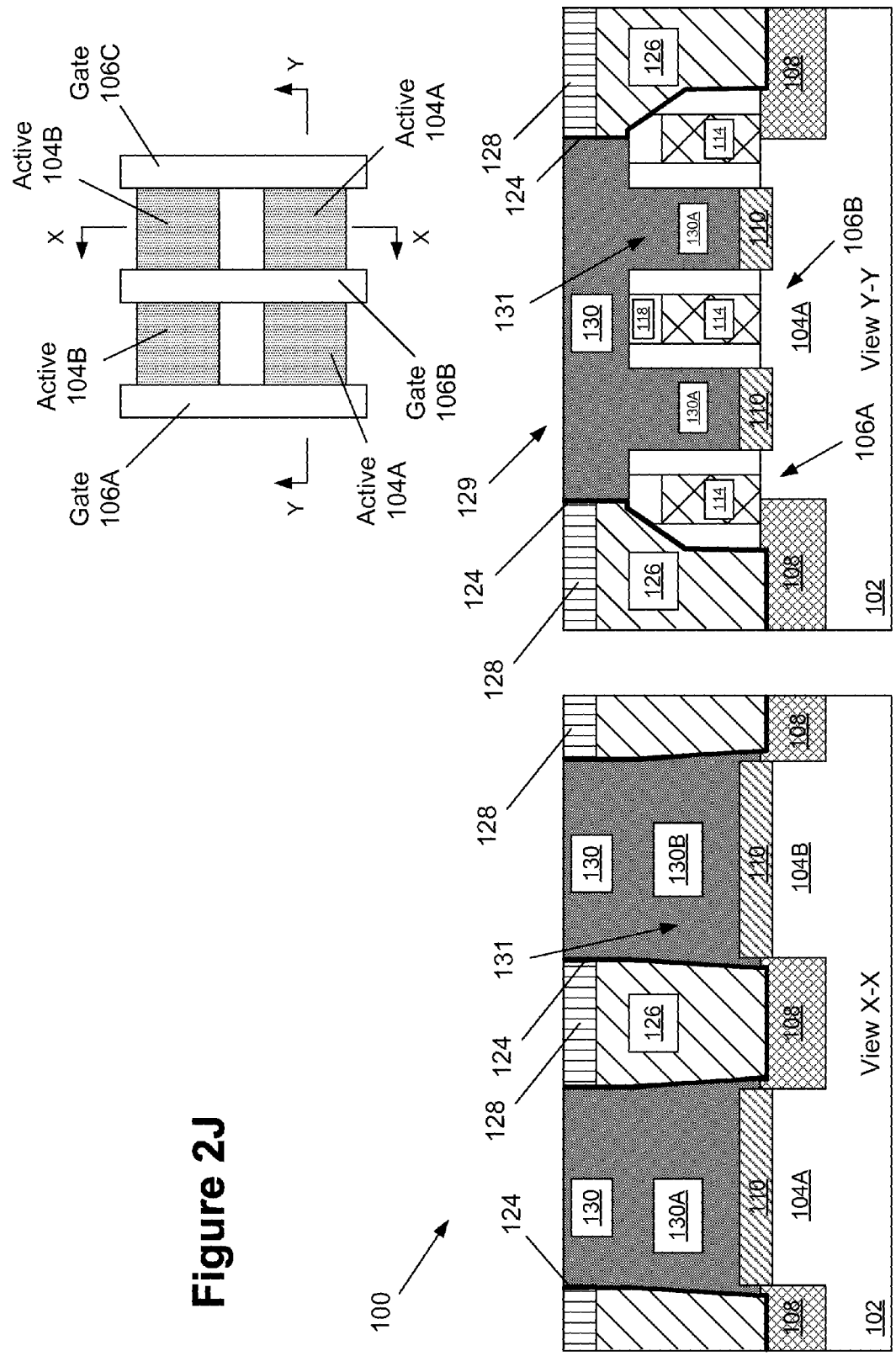

The next major operation involves formation of conductive contact structures in the contact openings 131 that will provide electrical connection to the source/drain regions 110. The conductive contact structures may take a variety of forms, e.g., well-known trench silicide regions that extend for substantially the entire dimension of the active regions 104A-B in the gate width direction of the transistor device. Accordingly, FIG. 2J depicts the product after one or more conductive materials 130 were formed on the product 100. In one illustrative embodiment, the conductive materials 130 may be formed by forming an initial metal silicide material (not separately shown) and thereafter over-filling the remaining portions of the contact openings 131 and the initial openings 129 with a conductive material, such as tungsten. Thereafter, as depicted, a CMP process was performed to remove excess materials using the cap layers 128 as a polish-stop. At this point, conductive contact structures 130A are formed on the source/drain regions 110 in the active region 104A for the transistor device that includes the gate structure 106B (see view Y-Y), while conductive contact structures 130B are formed on the active region 104B for the neighboring transistor device (see view X-X).

Figure 2K:
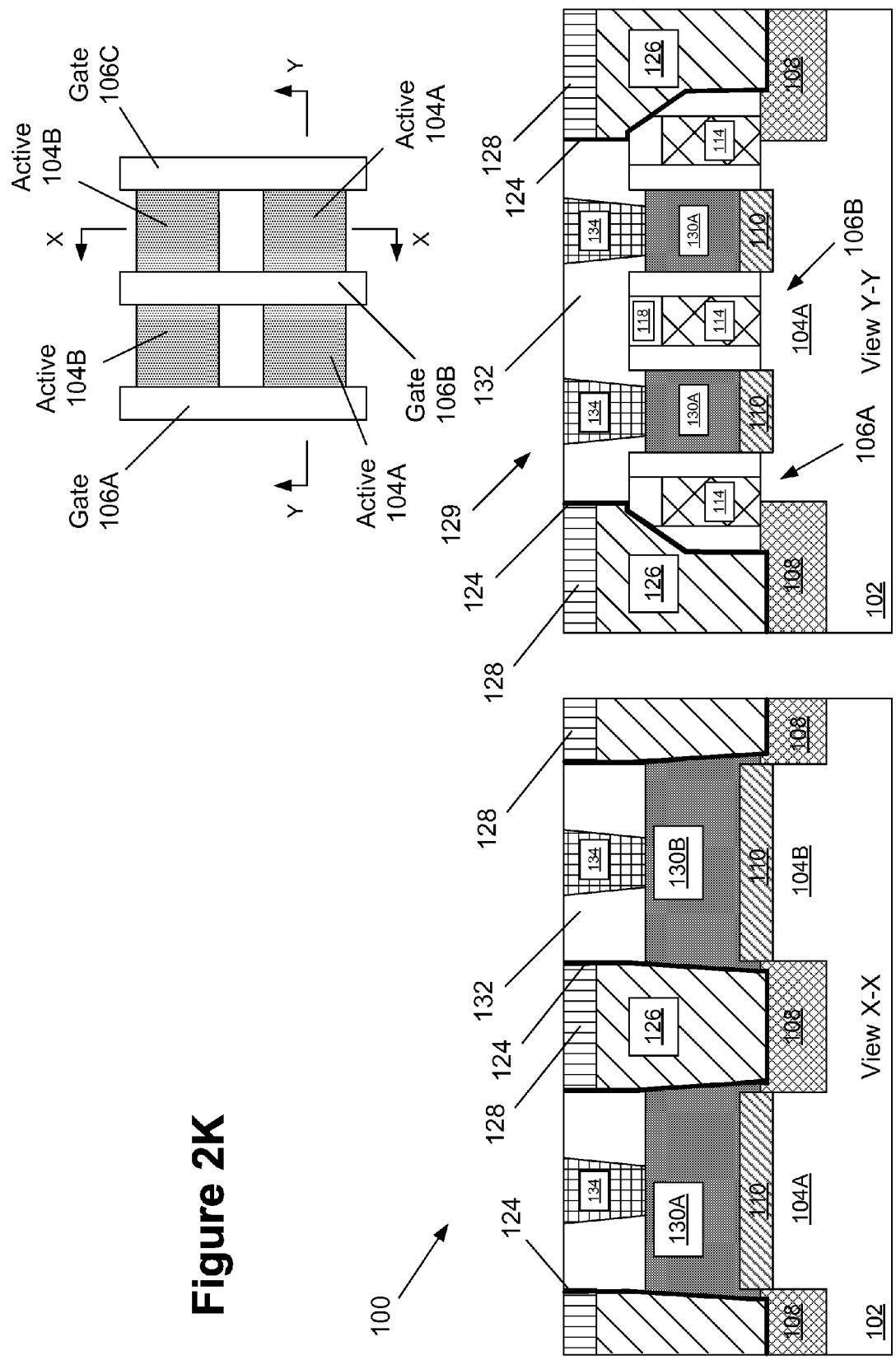

FIG. 2K depicts the product 100 after several process operations were performed. First, a timed, recess etching process was performed on the conductive materials 130 to separate the two conductive contact structures 130A from each other (see view Y-Y). The amount of recessing of the conductive materials 130 may vary depending upon the particular application. Next, another layer of insulating material 132, e.g., silicon dioxide, was deposited above the recessed conductive materials 130 and in the remaining portions of the initial openings 129 so as to contact the liner layer 124. Then, one or more planarization processes (e.g., CMP) were performed on the layer of insulating material 132 such that the upper surface of the layer of insulating material 132 was substantially even with the upper surfaces of the cap layers 128. Thereafter, the layer of insulating material 132 was patterned so as to expose at least portion of the conductive contact structures 130A, 130B, and a conductive contact 134 was formed in the patterned layer of insulating material 132 so as to establish electrical contact to the conductive contact structures 130A, 130B using traditional contact formation techniques. Of course, the shape and configuration of the contacts 134 may vary. In some applications they may be discrete point-type or post-type contacts or they may be line-type structures (not shown) that extend substantially for the same dimension as that of the active regions 104A in the gate width direction of the transistor device.

Figure 2L:
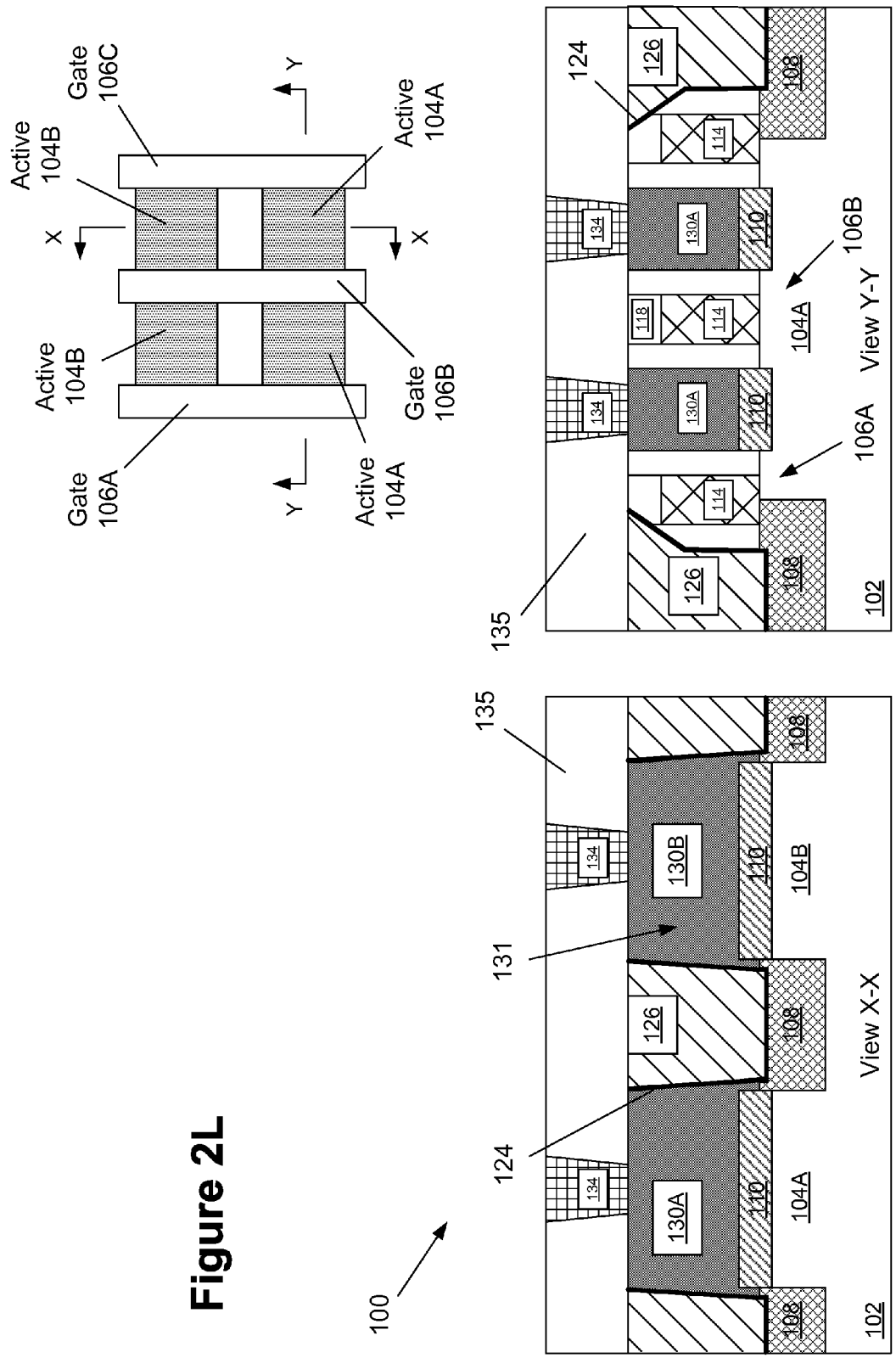

FIG. 2L depicts an alternative technique for removing the conductive materials 130 to separate the two conductive contact structures 130A from each other (see view Y-Y). In this technique, one or more CMP process operations are performed to planarize the materials on the substrate with the upper surface of the gate cap layers 118. Thereafter, another layer of insulating material 135 is formed above the gate structures, and the above-described contacts 134 are formed in the layer of insulating material 135.

Figure 2M:
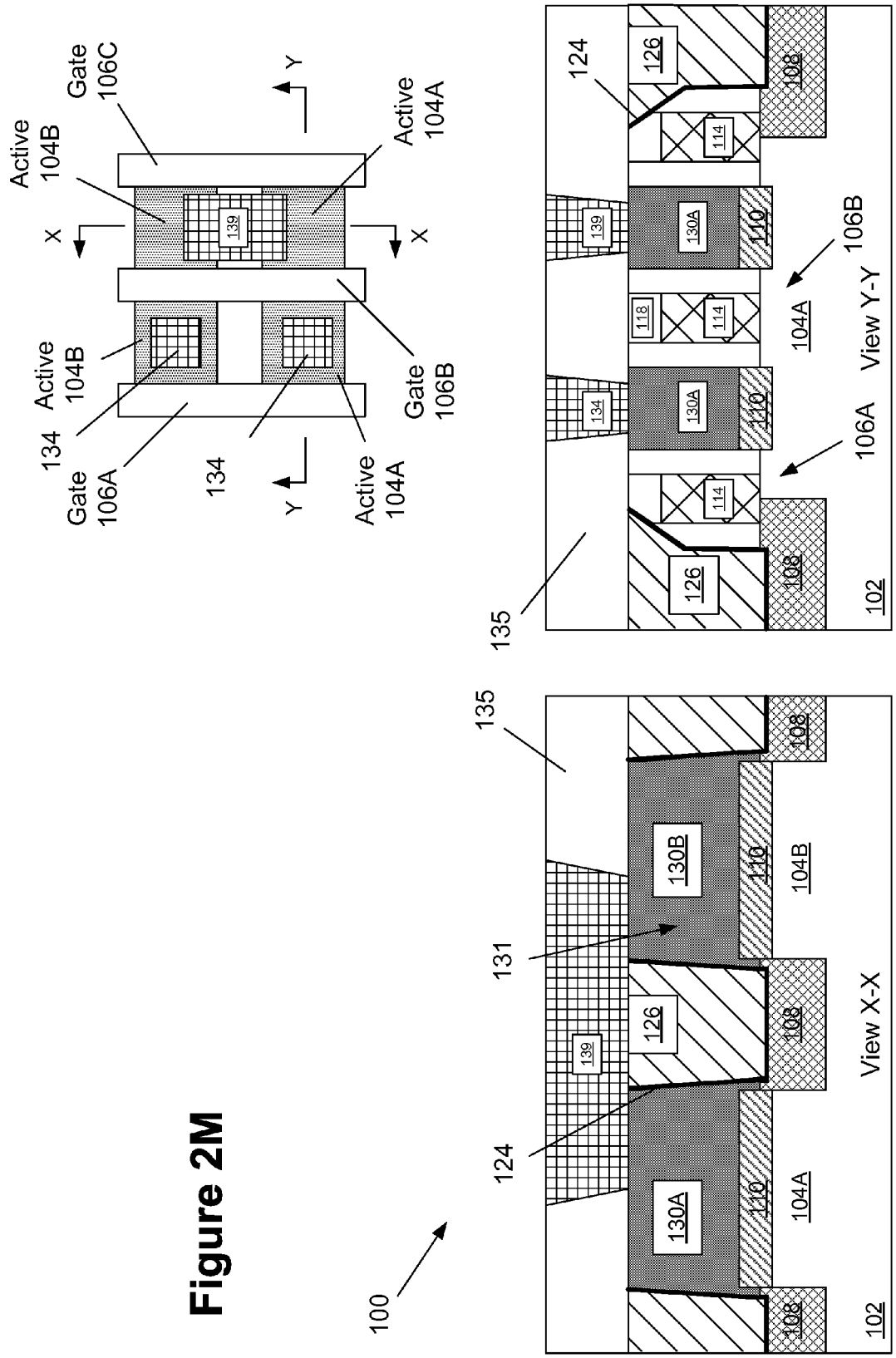

FIG. 2M depicts yet another alternative contact arrangement that may be employed using the novel techniques disclosed herein. In this technique, one or more CMP process operations are performed to planarize the materials on the substrate with the upper surface of the gate cap layers 118 to separate the two conductive contact structures 130A from each other (see view Y-Y). Thereafter, the above-described layer of insulating material 135 was formed. In this case, a shared contact structure 139 is formed between a source/drain region of the device formed on the active region 104A and a source/drain region of the device formed on the active region 104B (see simplistic plan view), while non-shared contacts 134 are formed to contact the other source/drain regions.

FIGS. 3A-3I depict yet other illustrative methods disclosed for forming self-aligned contact (SAC) structures on semiconductor devices and the resulting semiconductor devices. Relative to the process flow described in FIGS. 3A-3I, the process flow in FIGS. 2A-2M employs more masks, but it does allow for the formation of the shared contact structure 139 between the source/drain contacts 130A and 130B. In the embodiment in FIGS. 3A-3I, a shared contact structure could be formed, but it would have to be formed in an upper metallization layer, e.g., Metal 1.

Figure 3A:
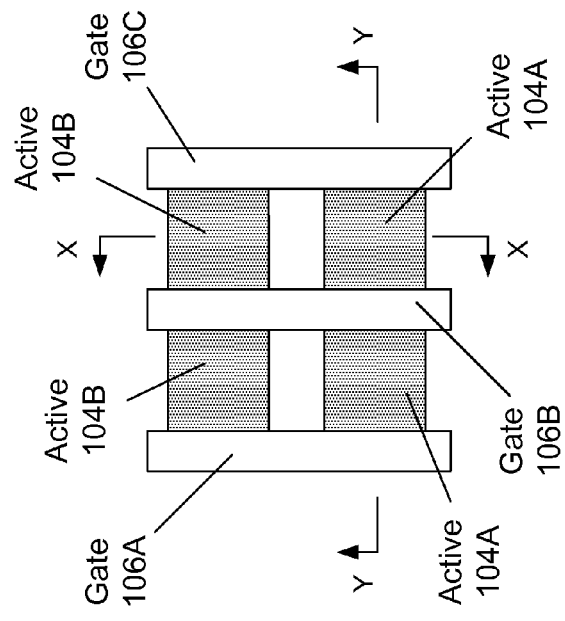
Figure 3A:
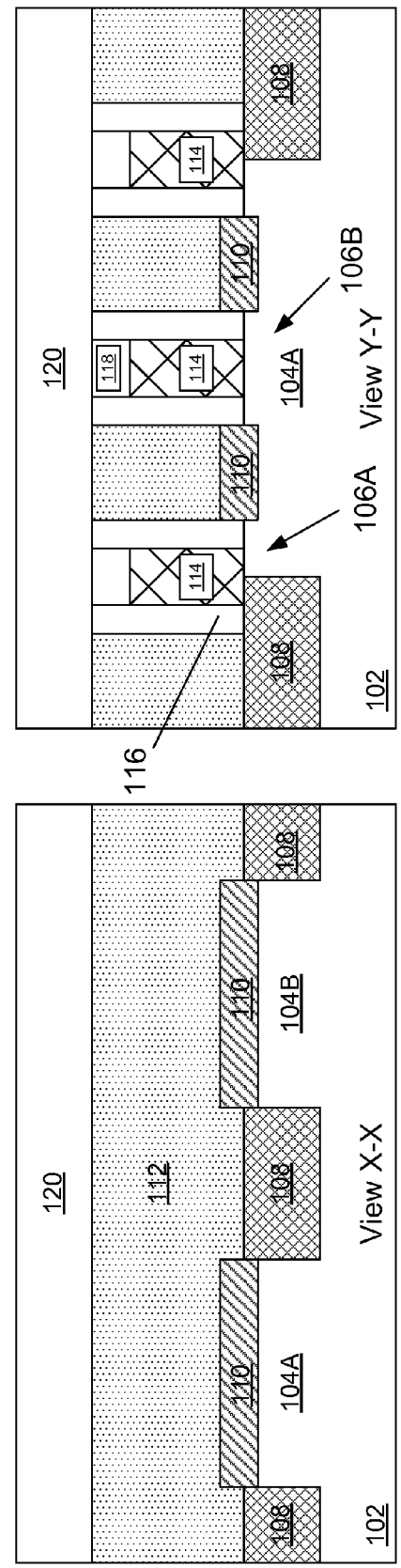

FIG. 3A depicts the product 100 at a point in fabrication that corresponds to that shown in FIG. 2B above, i.e., after the layer of masking material 120 was blanket deposited above the product 100.

Figure 3B:
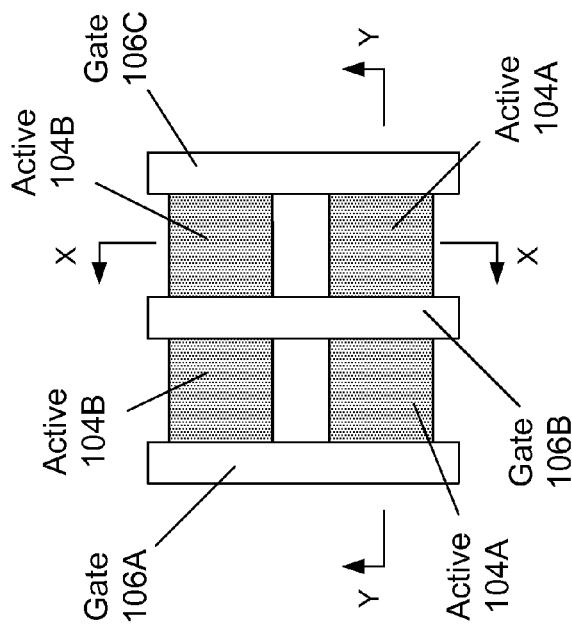
Figure 3B:
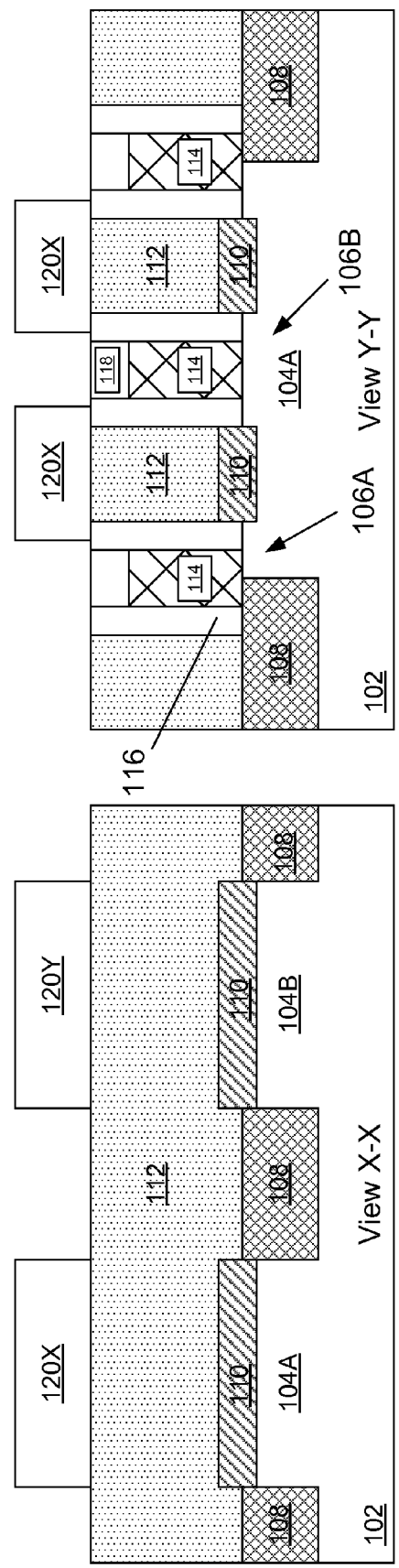

FIG. 3B depicts the product 100 after one or more etching processes were performed through a patterned etch mask (not shown) to pattern the layer of masking material 120 and thereby define a patterned masking layer 120 comprised of a plurality of masking layer features 120X-Y. In this embodiment, as shown in view Y-Y, the masking layer features 120X cover the source/drain regions 110 positioned adjacent the gate structure 106B while leaving at least portions of the gate structure 106B (i.e., the gate cap layer 118 and portions of the spacers 116) exposed.

Figure 3C:
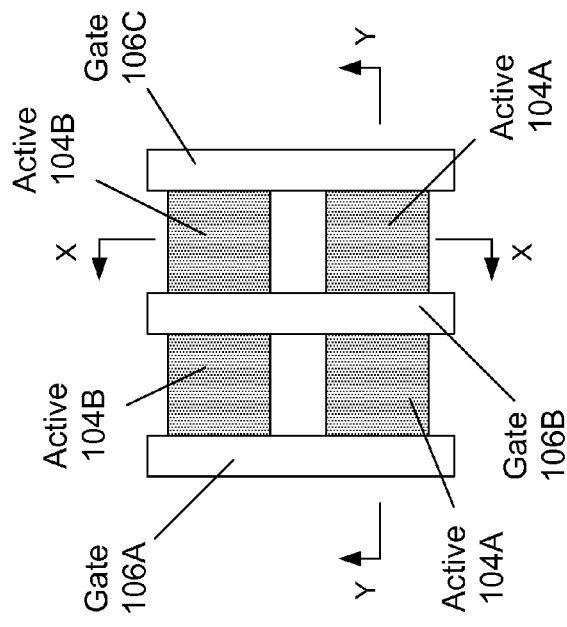
Figure 3C:
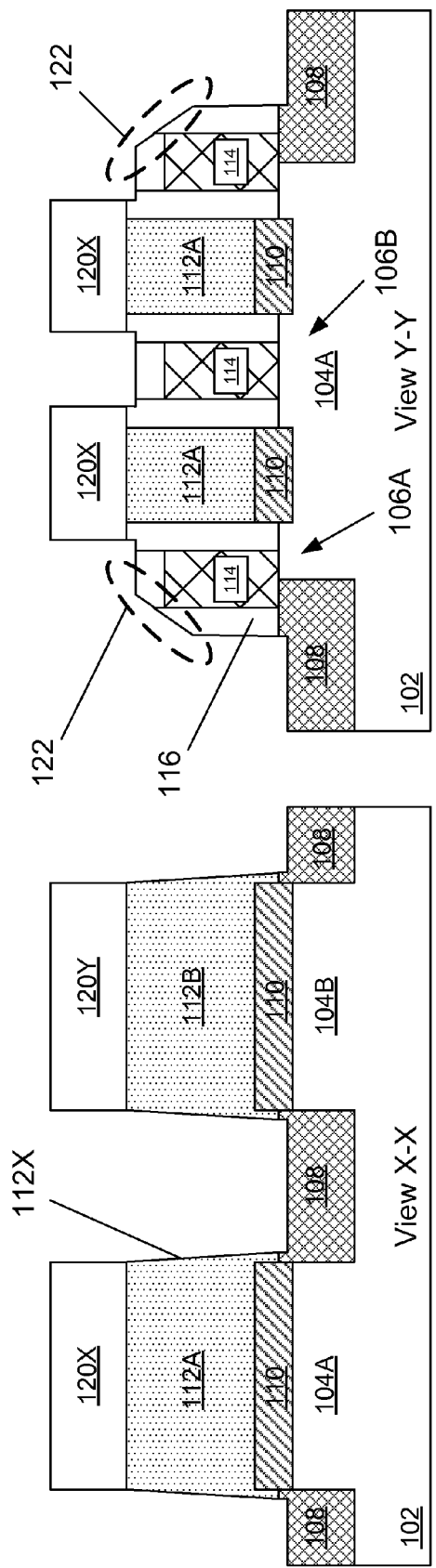

FIG. 3C depicts the product 100 after the above-described one or more etching processes were performed through the patterned masking layer 120 to remove the exposed portions of the layer of insulating material 112. As before, this etching process results in the formation of islands of the insulating material 112A and 112B positioned, respectively, above the first and second active regions 104A and 104B and under the masking layer features 120X and 120Y. As indicated in the view X-X, the ends 112X of the islands of the insulating material 112A and 112B are exposed by this etching process. Moreover, as depicted in the dashed-line regions 122, during this etching process, some of the exposed portions of the spacers 116 and gate cap layers 118 of the gate structures 106A and 106C may be consumed. However, the masking layer features 120X positioned above and adjacent the gate structure 106B protect the gate cap layer 118 and the spacers 116 of the gate structure 106B such that they are not as susceptible to an excessive amount of undesired consumption during this etching process.

FIG. 3D depicts the product 100 after several process operations were performed. First, the above-described liner layer 124 was formed on the product 100 by performing a conformal deposition process. As before, the liner layer 124 is formed such that it contacts the ends 112X of the islands of the insulating material 112A and 112B as well as all of the side surfaces 125 of the masking layer features 120X-Y. Then, the above-described layer of insulating material 126, e.g., silicon dioxide, was blanket-deposited across the product 100. Then, one or more planarization processes (e.g., CMP) were performed on the layer of insulating material 126 and the liner layer 124 such that the upper surface of the layer of insulating material 126 was substantially even with the upper surface of the patterned masking layer 120.

Figure 3E:
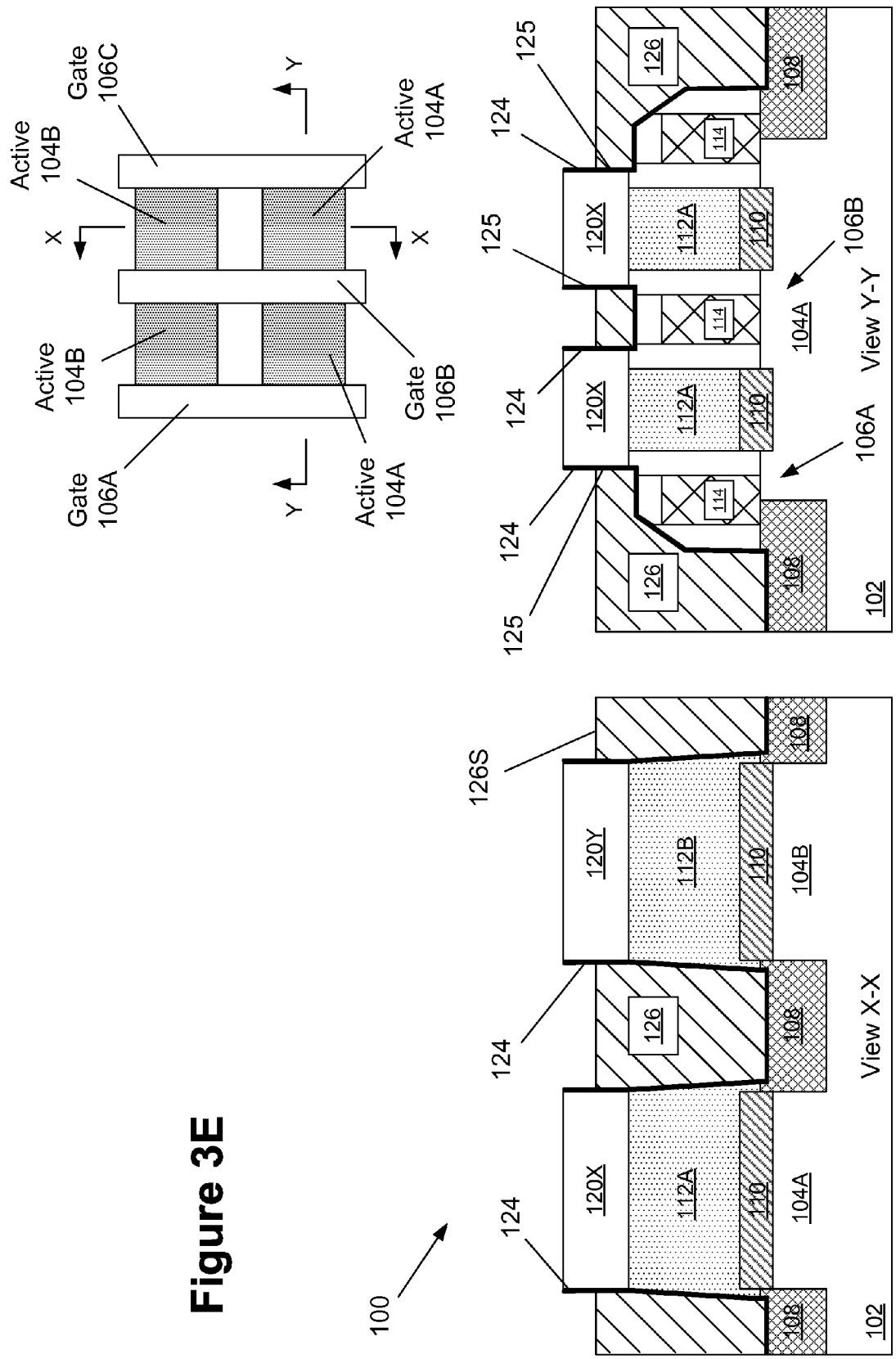

FIG. 3E depicts the product 100 after the above-described timed, recess etching process was performed on the exposed portions of the layer of insulating material 126 to form a recessed layer of insulating material 126 having the recessed surface 126S. The amount of recessing of the layer of insulating material 126 may vary depending upon the particular application.

Figure 3F:
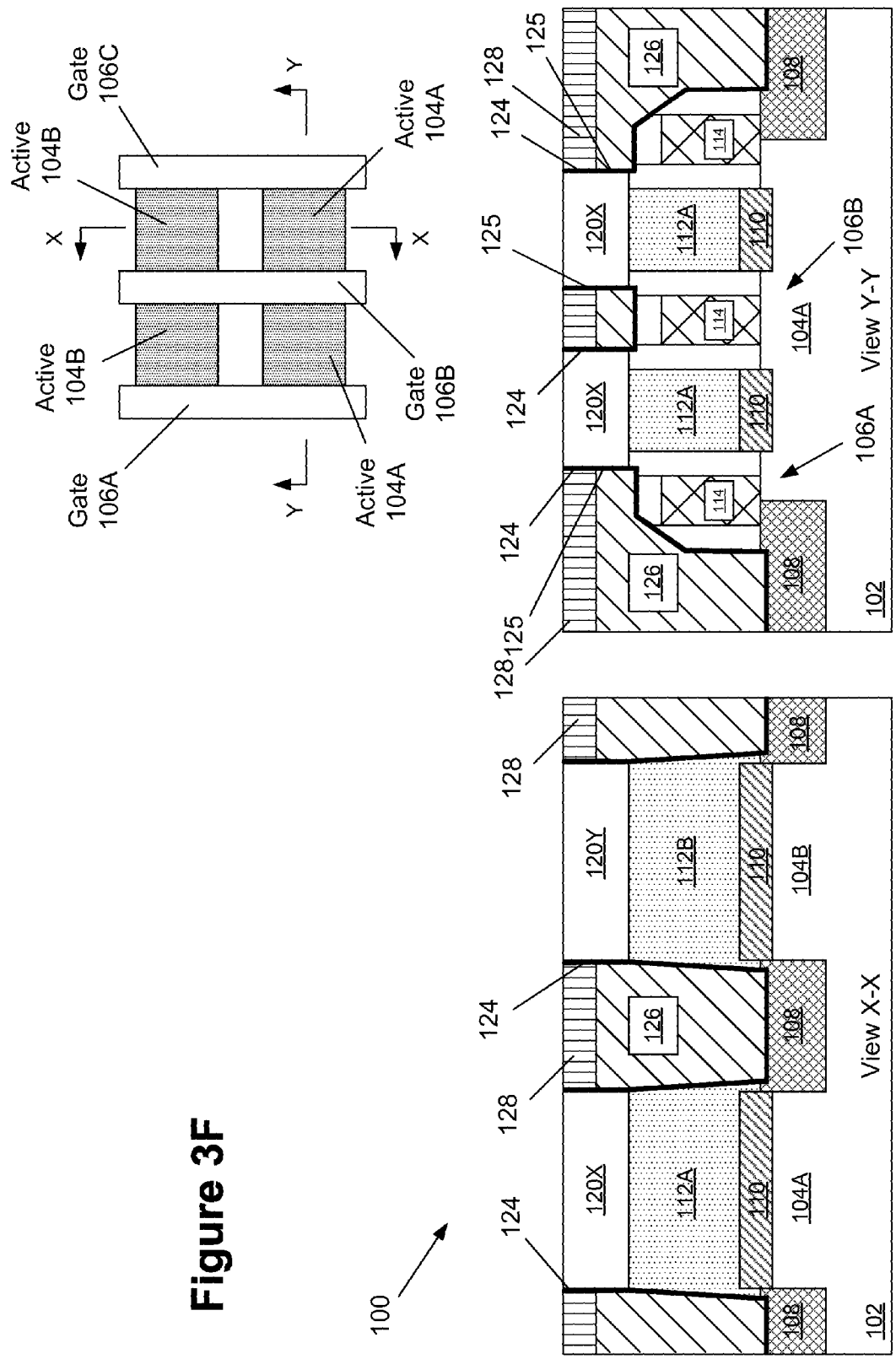

FIG. 3F depicts the product 100 after the above-described additional cap layers 128 were formed on the product 100 above the recessed layer of insulating material 126.

Figure 3G:
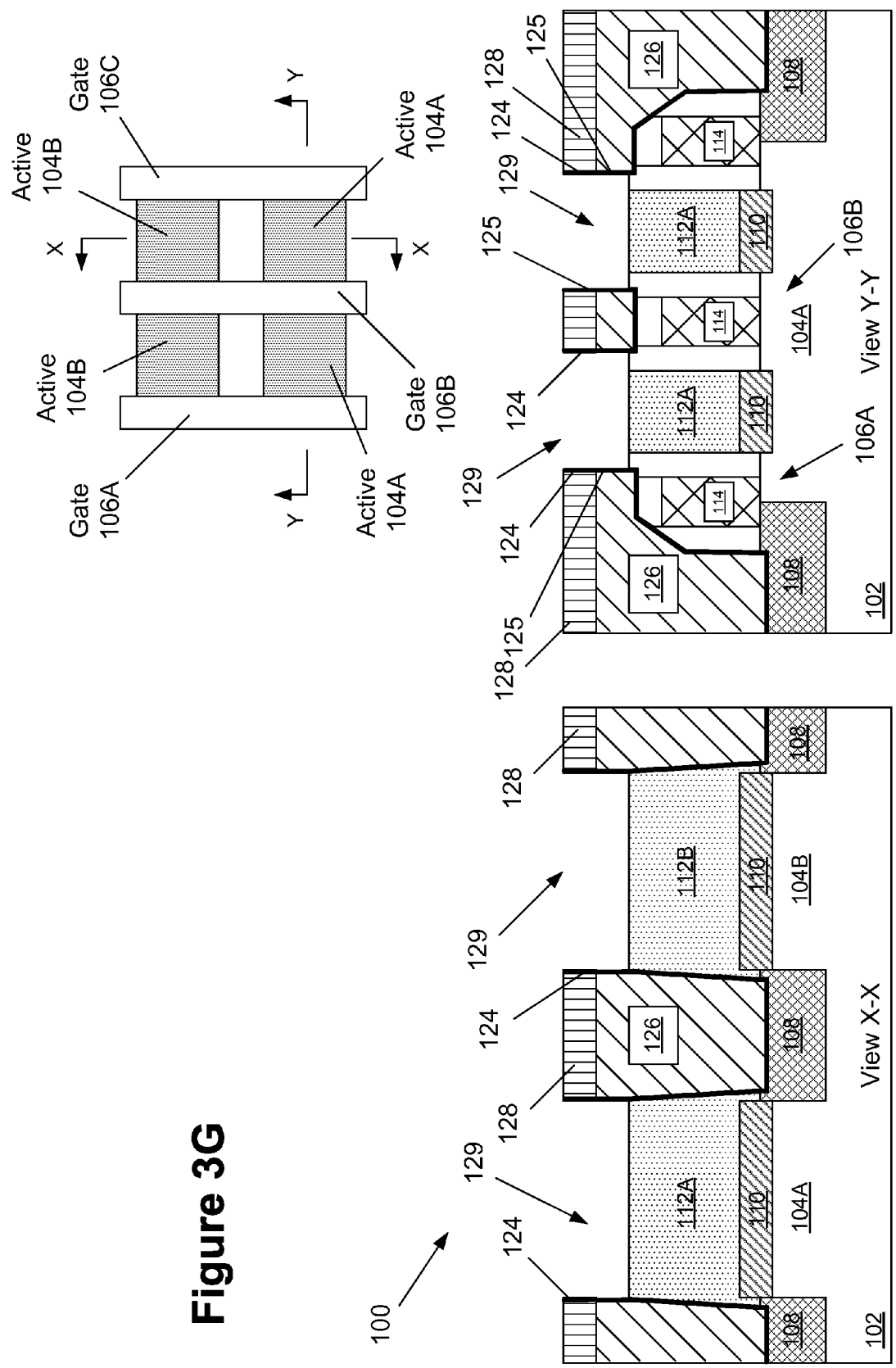

FIG. 3G depicts the product 100 after a selective etching process was performed to selectively remove the patterned masking layer 120, including the masking layer features 120X-Y, relative to the surrounding materials. This results in the formation of the above-described plurality of initial openings 129 that expose the islands of the insulating material 112A and 112B. However, in this embodiment, portions of the insulating material 126, the liner layer 124 and the protective cap layer 128 remain positioned above the gate structure 106B. Note that these initial openings 129 are defined by the liner layer 124.

Figure 3H:
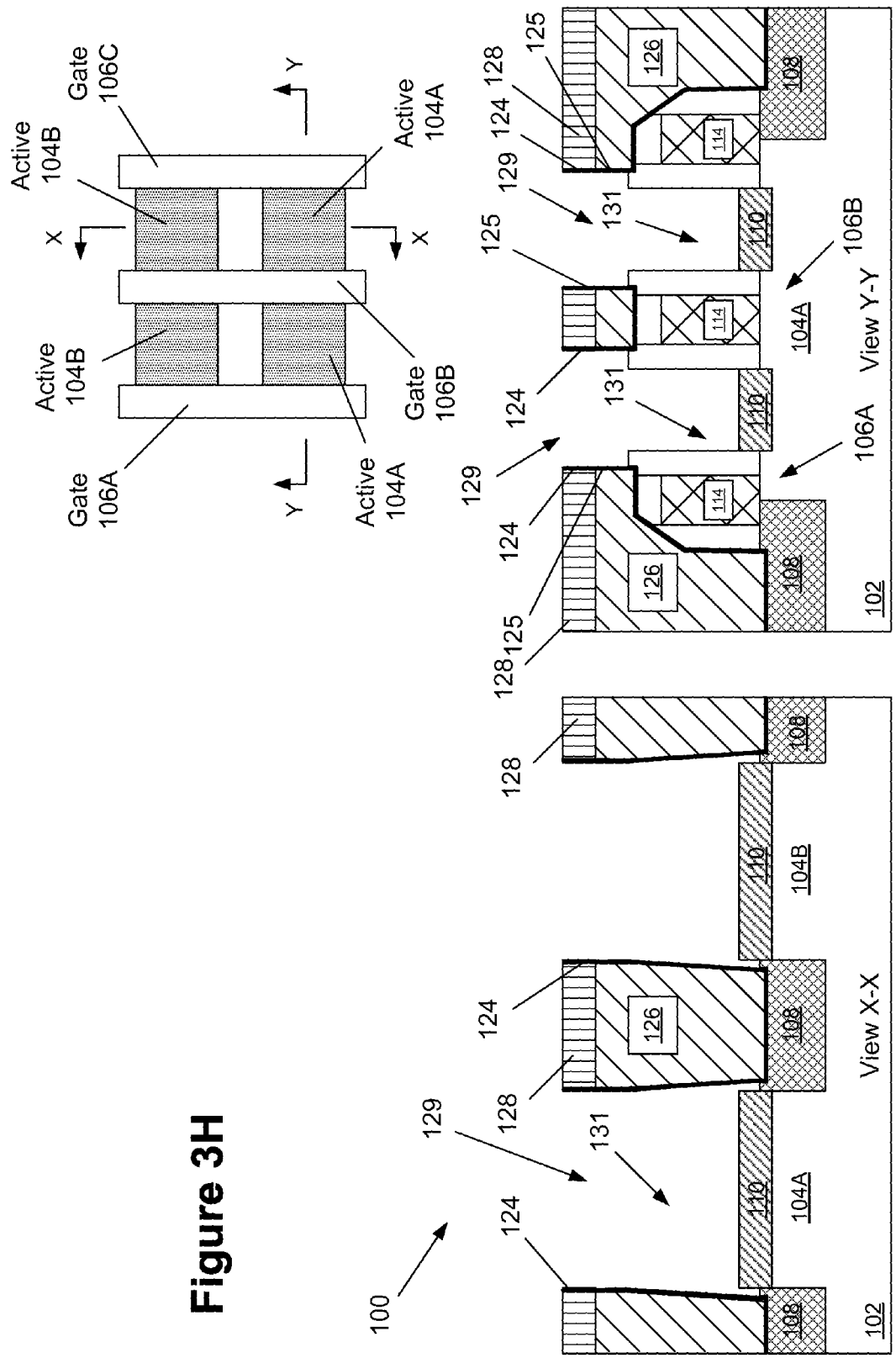

FIG. 3H depicts the product 100 after a selective etching process was performed through the initial openings 129 to selectively remove the exposed portions of the layer of insulating material 112 relative to the surrounding materials and thereby define contact openings 131 that expose the source/drain regions 110 adjacent to the gate structure 106B for further processing. As before, using the methods disclosed herein, the portions of the layer of insulating material 126 are completely encapsulated by protective materials, e.g., the liner layer 124 and the cap layers 128 when the exposed portions of the insulating material 112 are removed, as depicted in FIG. 3H. Thus, as noted above, using the methods disclosed herein, there is less chance of "blow-out" or loss of dimensional control of the size of the openings 131 where conductive materials will subsequently be formed on the product 100 to establish electrical connections to the source/drain regions 110.

Figure 3I:
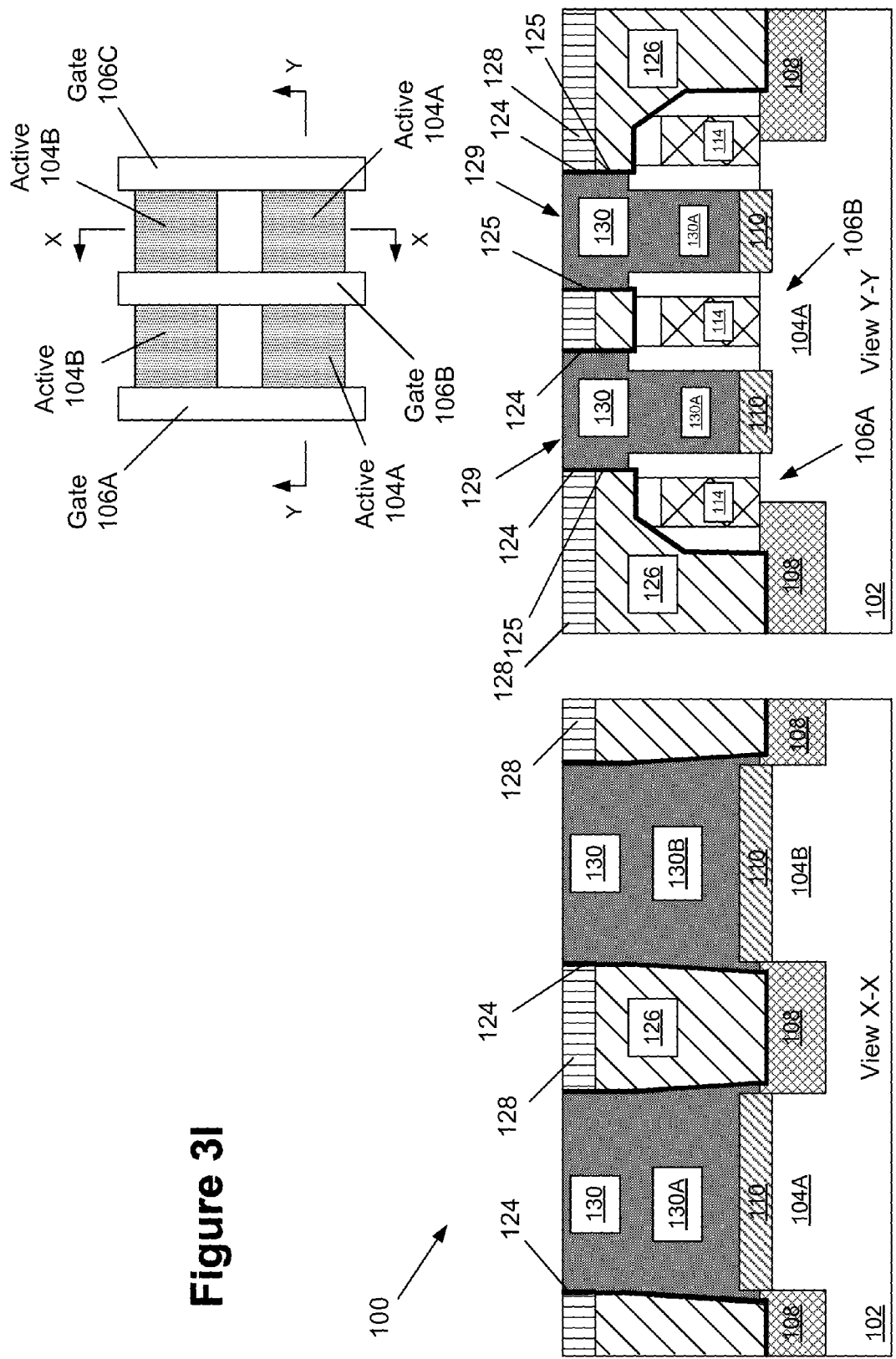

FIG. 3I depicts the product 100 after the above-described conductive contact structures 130A were formed on the source/drain regions 110 in the active region 104A for the transistor device formed thereabove (see view Y-Y), while conductive structures 130B were formed on the source/drain regions 110 in the active region 104B for the neighboring transistor device. Using this method, due to the formation of the masking layer features 120X-Y in the masking layer 120 (see FIG. 3B, view Y-Y), there is no need to perform the recessing operations described above with respect to FIG. 2K.

In addition to the novel methods disclosed herein, those skilled in the art will appreciate that a novel illustrative integrated circuit product 100 is disclosed as well. In one embodiment, with reference to FIGS. 2K and 3I (views X-X), the product 100 includes, among other things, first and second source/drain regions 110 defined in first and second spaced-apart active regions 104A, 104B, respectively, an isolation structure 108 positioned between the first and second spaced-apart active regions 104A, 104B, first and second source/drain contact structures 130A, 130B that are conductively coupled to the first and second source/drain regions, respectively, a liner layer 124 that is positioned above the isolation structure 108 and on and in contact with both the first and second source/drain contact structures 130A, 130B, and a layer of insulating material 126 positioned between the first and second source/drain contact structures 130A, 130B, above the isolation structure 108 and on and in contact with the liner layer 124. In additional embodiments, the protective layer 128 is formed on and in contact with the insulating material 126 and on and in contact with the liner layer 124 so as to encapsulate the insulating material 126.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a self-aligned contact to a source/drain region of a transistor device positioned between two adjacent gate structures formed above a semiconductor substrate, the method comprising:
   forming a structure comprised of an island of a first insulating material positioned between said gate structures above said source/drain region and under a masking layer feature of a patterned masking layer;
   forming a liner layer that contacts said island of said first insulating material and said masking layer feature;
   selectively removing said masking layer feature relative to said gate structures to thereby form an initial opening that is defined by said liner layer, said initial opening exposing said island of said first insulating material;
   performing at least one isotropic etching process through said initial opening to remove said island of said first insulating material and thereby define a contact opening that exposes said source/drain region; and
   forming a conductive contact structure in said contact opening that is conductively coupled to said source/drain region.

2. The method of claim 1, wherein said liner layer contacts all side surfaces of said masking layer feature and two side surfaces of said island of said first insulating material.

3. The method of claim 1, wherein, after forming said liner layer and prior to removing said masking layer feature, the method further comprises:
   forming a second layer of insulating material that has an upper surface that is substantially planar with an upper surface of said masking layer feature;
   recessing said second layer of insulating material such that it has a recessed upper surface that is positioned below said upper surface of said masking layer feature; and
   forming a protective cap layer on said recessed upper surface of said second layer of insulating material, said protective cap layer contacting said liner layer.

4. The method of claim 1, wherein said first insulating material is comprised of silicon dioxide, said liner layer is comprised of silicon nitride, said patterned masking layer is comprised of amorphous silicon and said gate structures are each comprised of a silicon nitride gate cap layer and silicon nitride sidewall spacers.

5. The method of claim 1, wherein forming said conductive contact structure in said contact opening comprises:
   forming at least one conductive material in said contact opening such that said contact opening is over-filled;
   performing a recess etching process on said at least one conductive material such that, after said recess etching process is performed, said conductive contact structure is formed in said contact opening and it has an upper surface that is positioned at a height level that is below an upper surface of a gate cap layer of said gate structures;
   forming a second layer of insulating material in said initial opening and above said conductive contact structure, said second layer of insulating material contacting said liner layer; and
   forming a contact in said second layer of insulating material that is conductively coupled to said upper surface of said conductive contact structure.

6. The method of claim 1, wherein forming said conductive contact structure in said contact opening comprises:
   forming at least one conductive material in said contact opening such that said contact opening is over-filled and said at least one conductive material contacts said liner layer;
   performing at least one planarization process on at least said at least one conductive material so as to remove all materials positioned above a gate cap layer of each of said gate structures and thereby define said conductive contact structure in said contact opening;
   forming a second layer of insulating material above said gate structures and above said conductive contact structure; and
   forming a contact in said second layer of insulating material that is conductively coupled to an upper surface of said conductive contact structure.

7. The method of claim 1, wherein forming said conductive contact structure in said contact opening comprises:

forming at least one conductive material in said contact opening such that said contact opening is over-filled and said at least one conductive material contacts said liner layer; and performing a planarization process on said at least one conductive material.

8. The method of claim 1, wherein each of said gate structures comprises a gate insulation layer, a gate electrode, a gate cap layer and sidewall spacers.

9. The method of claim 1, wherein said two adjacent gate structures comprise first and second gate structures, a third gate structure is disposed adjacent said second gate structure, and said patterned masking layer covers only a portion of said first, second and third gate structures.

10. The method of claim 1, wherein said two adjacent gate structures comprise first and second gate structures, a third gate structure is disposed adjacent said second gate structure, and said patterned masking layer covers all of a top surface of said second gate structure.

11. A method of forming self-aligned contacts to a plurality of source/drain regions of a transistor device, said transistor device comprising a gate structure that is positioned between two additional gate structures formed above a semiconductor substrate, the method comprising:

forming a first layer of insulating material between said gate structure and said additional gate structures above said source/drain regions;

forming a patterned masking layer comprising a masking layer feature that covers portions of said first layer of insulating material above said source/drain regions and a portion of said gate structure, while leaving other portions of said first layer of insulating material exposed;

performing a first etching process through said patterned masking layer to remove the exposed portions of said first layer of insulating material leaving islands of said first insulating material positioned above each of said source/drain regions and under said masking layer feature;

forming a liner layer that contacts said islands of said first insulating material and all side surfaces of said masking layer feature;

removing said masking layer feature to define an initial opening that is defined by said liner layer, said initial opening exposing said islands of first insulating material;

performing at least one isotropic etching process through said initial opening to remove said islands of insulating material and thereby define a plurality of contact openings that expose said source/drain regions; and forming a conductive contact structure in each of said plurality of contact openings, wherein each of said conductive contact structures is conductively coupled to one of said source/drain regions.

12. The method of claim 11, wherein said additional gate structures are active-edge gate structures.

13. The method of claim 11, wherein, after forming said liner layer and prior to removing said masking layer feature, the method further comprises:

forming a second layer of insulating material that has an upper surface that is substantially planar with an upper surface of said masking layer feature;

recessing said second layer of insulating material such that it has a recessed upper surface that is positioned below said upper surface of said masking layer feature; and forming a protective cap layer on said recessed upper surface of said second layer of insulating material, said protective cap layer contacting said liner layer.

14. The method of claim 11, wherein forming said conductive contact structure in each of said plurality of contact openings comprises:

forming at least one conductive material in said contact openings such that said contact openings are over-filled;

performing a recess etching process on said at least one conductive material such that, after said recess etching process is performed, a conductive contact structure is formed in each of said contact openings and they each have an upper surface that is positioned at a height level that is below an upper surface of a gate cap layer of said gate structure;

forming a third layer of insulating material in said initial opening and above said conductive contact structures, said third layer of insulating material contacting said liner layer; and forming a plurality of contacts in said third layer of insulating material, wherein at least one of said plurality of contacts is conductively coupled to the upper surface of one of said conductive contact structures while another of said plurality of contacts is conductively coupled to the upper surface of the other of said conductive contact structures.

15. The method of claim 11, wherein forming said conductive contact structure in each of said plurality of the contact openings comprises:

forming at least one conductive material in said contact openings such that said contact openings are over-filled and said at least one conductive material contacts said liner layer;

performing at least one planarization process on at least said at least one conductive material so as to remove all materials positioned above a gate cap layer of each of said gate structures and thereby define said conductive contact structures in said contact openings;

forming a second layer of insulating material above said gate structures and above said conductive contact structures; and forming a plurality of contacts in said second layer of insulating material, each of which is conductively coupled to the upper surface of one of said conductive contact structures.

16. The method of claim 11, wherein said patterned masking layer covers only a portion of said gate structure.

17. The method of claim 11, wherein said patterned masking layer covers all of a top surface of said gate structure.

18. A method of forming self-aligned contacts to a plurality of source/drain regions of a transistor device, said transistor device comprising a gate structure that is positioned between two additional gate structures formed above a semiconductor substrate, the method comprising:

forming a first layer of insulating material between said gate structure and said additional gate structures above said source/drain regions;

forming a patterned masking layer comprising first and second masking layer features, each of which covers a portion of said first layer of insulating material positioned above one of said source/drain regions and only a portion of said gate structure, while leaving other portions of said first layer of insulating material exposed;

performing a first etching process through said patterned masking layer to remove the exposed portions of said first layer of insulating material leaving islands of said first insulating material positioned above each of said source/drain regions and under said first and second masking layer features;

forming a liner layer that contacts said islands of said first insulating material and all side surfaces of said first and second masking layer features;

removing said first and second masking layer features to define a plurality of initial openings that are defined by said liner layer, said initial openings exposing said islands of said first insulating material;

performing at least one isotropic etching process through said initial openings to remove said islands of said insulating material and thereby define a plurality of contact openings that expose said source/drain regions; and forming a conductive contact structure in each of said plurality of contact openings, wherein each of said conductive contact structures is conductively coupled to one of said source/drain regions.

19. The method of claim 18, wherein, after forming said liner layer and prior to removing said first and second masking layer features, the method further comprises:

forming a second layer of insulating material that has an upper surface that is substantially planar with an upper surface of said first and second masking layer features;

recessing said second layer of insulating material such that it has a recessed upper surface that is positioned below said upper surface of said first and second masking layer features; and forming a protective cap layer on said recessed upper surface of said second layer of insulating material, said protective cap layer contacting said liner layer.

20. The method of claim 18, wherein forming said conductive contact structures comprises:

forming at least one conductive material in said contact openings such that said contact openings are over-filled and such that said at least one conductive material contacts said liner layer in said initial openings; and performing a planarization process on said at least one conductive material.

\* \* \* \* \*